United States Patent
Tsutsue

(10) Patent No.: US 7,795,705 B2
(45) Date of Patent: Sep. 14, 2010

(54) SEMICONDUCTOR DEVICE AND MANUFACTURING METHOD THEREOF

(75) Inventor: Makoto Tsutsue, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/210,520

(22) Filed: Sep. 15, 2008

(65) Prior Publication Data

US 2009/0108409 A1   Apr. 30, 2009

(30) Foreign Application Priority Data

Oct. 24, 2007   (JP)   ............................. 2007-276464

(51) Int. Cl.
    *H01L 23/544*   (2006.01)
(52) U.S. Cl. ...................................... 257/620; 257/618
(58) Field of Classification Search .................. 257/618, 257/620
    See application file for complete search history.

(56) References Cited

U.S. PATENT DOCUMENTS

| 2004/0026785 | A1 | 2/2004 | Tomita |
| 2005/0093169 | A1 | 5/2005 | Kajita |
| 2006/0038297 | A1 | 2/2006 | Usami et al. |
| 2007/0102791 | A1 | 5/2007 | Wu |
| 2007/0102792 | A1 | 5/2007 | Wu |

FOREIGN PATENT DOCUMENTS

| JP | 2004-079596 | 3/2004 |
| JP | 2005-142262 | 6/2005 |

*Primary Examiner*—Long Pham
(74) *Attorney, Agent, or Firm*—McDermott Will & Emery LLP

(57) ABSTRACT

A semiconductor device includes an element formed on a substrate, at least one insulating film formed on the substrate, and a seal ring formed in the insulating film so as to surround a region where the element is formed and to extend through the insulating film. The semiconductor device further includes a void region including a void and formed in the insulating film in a region located outside the seal ring when viewed from the element.

25 Claims, 15 Drawing Sheets

SEMICONDUCTOR DEVICE AND MANUFACTURING METHOD THEREOF

CROSS REFERENCE TO RELATED APPLICATION

This application claims priority under 35 U.S.C. §119 on Patent Application No. 2007-276464 filed in Japan on Oct. 24, 2007, the entire contents of which are hereby incorporated by reference.

BACKGROUND OF THE INVENTION

1. Field of the Invention

The invention relates to a semiconductor device having a seal ring formed so as to surround a chip region and a mechanism for protecting the seal ring, and a manufacturing method of such a semiconductor device.

2. Related Art

Semiconductor devices are generally produced by providing a multiplicity of ICs (Integrated Circuits), each formed by a plurality of elements and having a predetermined function, in a matrix pattern on a semiconductor wafer such as silicon.

A multiplicity of chip regions provided on the wafer are separated from each other by a lattice-shaped dicing region (scribe lines). After a multiplicity of chip regions are formed on a single wafer through a semiconductor manufacturing process, the wafer is diced along a dicing region into individual chips, whereby semiconductor devices are formed.

When such a wafer is diced into individual chips, chip regions located near a dicing region may be subjected to a mechanical impact. As a result, partial cracks and chippings may be produced in a dicing cross-section of diced chips, that is, semiconductor devices.

A technology generally proposed in view of this problem is to provide a seal ring around a chip region as a ring-shaped protective wall in order to prevent cracks from propagating through the chip region during a dicing process. The seal ring has not only an effect of preventing propagation of cracks during the dicing process but also an effect of preventing moisture and mobile ions from entering from outside the chip.

However, if a part of the seal ring is destroyed due to an impact applied in the dicing process, moisture and mobile ions may enter from outside the chip, and reliability of the chip may not be ensured.

In view of this problem, Japanese Laid-Open Patent Publication No. 2004-79596 (hereinafter, referred to as Patent document 1) proposes a method of forming an opening in a passivation film formed at the topmost surface of a chip. The opening is formed in order to prevent a stress that is applied in a dicing process from propagating through the passivation film into a chip region.

FIG. 20 shows a cross-sectional structure of a conventional semiconductor device having a seal ring (this figure shows a state in which the semiconductor device is formed on a wafer).

As shown in FIG. 20, a plurality of chip regions 142, which will become semiconductor chips by a dicing process, are provided on a semiconductor substrate 111 made of a silicon wafer. The plurality of chip regions 142 are separated from each other by a dicing region 141. A layered structure of an element isolation film 112, a plurality (first through sixth) interlayer insulating films 113 through 118, and a passivation film 119 is formed on the semiconductor substrate 111. An active layer 106 that forms an element such as a transistor is provided in each chip region 142. The active layer 106 is surrounded by the element isolation film 112.

A first via 121 connecting to the active layer 106 is formed in the first interlayer insulating film 113. A first interconnect 122 connecting to the first via 121 is formed in the second interlayer insulating film 114. A second via 123 connecting to the first interconnect 122 is formed in the third and fourth interlayer insulating films 115 and 116, and a second interconnect 124 connecting to the second via 123 is formed in the fourth interlayer insulating film 116. A third via 125 connecting to the second interconnect 124 is formed in the fifth and sixth interlayer insulating films 117 and 118, and a third interconnect 126 connecting to the third via 125 is formed in the sixth interlayer insulating film 118. A pad 127 connecting to the third interconnect 126 is formed in the passivation film 119.

As shown in FIG. 20, a seal ring 143 is formed in a layered structure of the plurality of interlayer insulating films 113 through 118 in the periphery of the chip region 142. The seal ring 143 extends through the layered structure and continuously surrounds the chip region 142. The seal ring 143 is formed by, for example, alternately using an interconnect formation mask and a via formation mask.

More specifically, the seal ring 143 is formed by a conductive film 107 formed in the semiconductor substrate 111, a first seal via 131 formed in the first interlayer insulating film 113 and connecting to the conductive layer 107, a first seal interconnect 132 formed in the second interlayer insulating film 114 and connecting to the first seal via 131, a second seal via 133 formed in the third and fourth interlayer insulating films 115 and 116 and connecting to the first seal interconnect 132, a second seal interconnect 134 formed in the fourth interlayer insulating film 116 and connecting to the second seal via 133, a third seal via 135 formed in the fifth and sixth interlayer insulating films 117 and 118 and connecting to the second seal interconnect 134, and a third seal interconnect 136 formed in the sixth interlayer insulating film 118 and connecting to the third seal via 135. Note that, in the present application, a portion of a seal ring which is formed by an interconnect formation mask is referred to as a seal interconnect, and a portion of a seal ring which is formed by a via formation mask is referred to as a seal via. As shown in Patent document 1, in the passivation film 119, an opening 144 extending to the sixth interlayer insulating film 118 is formed on the dicing region 141 side of the seal ring 143.

Japanese Laid-Open Patent Publication No. 2005-142262 (hereinafter, referred to as Patent document 2), on the other hand, describes that a hollow groove is formed outside a seal ring by embedding an interconnect material (copper) in an interconnect layer and removing the interconnect material by etching, as shown in FIG. 21.

SUMMARY OF THE INVENTION

The semiconductor device disclosed in Patent document 1 described above has an effect of preventing cracks and impact which are generated in the dicing process of the wafer from propagating into the chip region because an opening is formed in the passivation film formed at the topmost surface of the chip. This effect, however, is limited only to the passivation film portion. In other words, in the interlayer insulating films that are present under the passivation film, cracks and impact which are generated in the dicing process of the wafer propagate through the interlayer insulating films to the seal ring. If the impact generated in the dicing process causes chippings and cracks in a part of the seal ring, moisture, mobile ions, and the like cannot be sufficiently prevented from entering the chip region.

In this semiconductor device, the seal ring is continuously formed in the periphery of the chip region. When the seal ring absorbs cracks and impact and a part of the seal ring is destroyed in the dicing process, the destroyed part of the seal ring may protrude from an end of the diced semiconductor device (semiconductor chip). If the semiconductor device in such a state is packaged, debris from the seal ring contacts bonding wires, resulting in a product defect.

When semiconductor elements and interconnects connecting to the semiconductor elements are reduced in dimensions, the capacitance between interconnects is increased and therefore the processing speed of a semiconductor device is reduced. In order to prevent such an increase in capacitance between interconnects and reduction in processing speed of the semiconductor device, a technology of preventing an increase in capacitance between interconnects by using a low dielectric constant interlayer insulating film such as a silicon oxide film has been developed.

However, a low dielectric constant interlayer insulating film generally has low mechanical strength. The low dielectric constant interlayer insulating film therefore does not have sufficient resistance to a stress that is generated in a dicing process as compared to an interlayer insulating film made of a conventionally used material. The low dielectric constant interlayer insulating film is therefore more likely to be damaged in the dicing process. It has been increasingly difficult to achieve the function to prevent propagation of cracks and the like during the dicing process and the function to prevent the entry of moisture, mobile ions, and the like from outside into the chip region by using only a seal ring as in a conventional example.

In the semiconductor device disclosed in Patent document 2 described above, a hollow groove is formed by etching an interconnect material of copper. It is therefore very difficult to form a hollow groove. Moreover, the hollow groove width is about the same as the interconnect width. Since the hollow groove width is large, each hollow groove has a large occupied area. It is therefore impossible to form a plurality of hollow grooves between a seal ring and a dicing portion. In other words, the degree of freedom in design for hollow groove formation is reduced.

In view of the above problems, the invention prevents chippings, cracks, and the like which are generated in a side surface of a chip when a wafer is diced into individual chips (semiconductor devices) from reaching and destroying a seal ring, and thus prevents the chippings, cracks, and the like from further propagating into a chip region. Reduction in moisture resistance and reliability of a semiconductor device is thus prevented.

A semiconductor device according to the invention includes: an element formed on a substrate; an insulating film formed on the substrate; a seal ring formed in the insulating film so as to surround a region where the element is formed and to extend through the insulating film; and a void region including at least one void and formed in the insulating film in a region located outside the seal ring when viewed from the element.

According to the semiconductor device of the invention, the void region including at least one void is formed outside the seal ring when viewed from the element. Therefore, even if cracks, stress, and the like are generated when a wafer is diced into individual semiconductor devices (semiconductor chips) along a dicing region that separates chip regions from each other, the void region can prevent such cracks, stress, and the like from reaching the seal ring. The seal ring can therefore be prevented from being chipped or destroyed and can reliably carry out one of its original functions, that is, a function to protect the inside of the chip region.

Preferably, the insulating film has a layered structure of a plurality of interlayer insulating films, and includes a via formed in at least one of the plurality of interlayer insulating films and electrically connected to the element, and an interconnect formed in at least one of the plurality of interlayer insulating films and electrically connected to the element. The seal ring preferably includes a seal via formed in the interlayer insulating film in which the via is formed, and a seal interconnect formed in the interlayer insulating film in which the interconnect is formed. The void region preferably includes a void formed at least in the interlayer insulating film in which the seal interconnect is formed.

The interlayer insulating film in which the seal interconnect is formed may be made of a low dielectric constant insulating film. The low dielectric constant insulating film generally has low mechanical strength. Therefore, by forming a void in the interlayer insulating film in which the seal interconnect is formed, the effect of preventing the seal interconnect from being damaged or destroyed in a dicing process and protecting the inside of the chip region can be significantly obtained.

Preferably, a width of the void is smaller than that of the interconnect. It is especially preferable that the width of the void is smaller than that of an interconnect having the smallest width among interconnects included in the semiconductor device.

In this case, the void can be prevented from being filled with an interconnect material such as Cu (copper), whereby the void can be easily formed. An impact that is generated during a dicing process can therefore be reliably blocked. Moreover, since the void width is small, each void has a small occupied area. Even a plurality of voids can therefore be easily formed between the seal ring and a dicing portion. In other words, the degree of freedom in void formation is improved.

The semiconductor device may further includes a dual damascene interconnect in which the via and the interconnect are formed integrally. The via and the interconnect can be structured in this way.

The interconnect and the via may be respectively formed in different interlayer insulating films of the plurality of interlayer insulating films.

Preferably, the interlayer insulating film in which the interconnect is formed is made of a film having a lower dielectric constant than that of the interlayer insulating film in which the via is formed.

Capacitance between interconnects can thus be reduced in the interlayer insulating film in which the interconnect is formed.

Preferably, the semiconductor device further includes a passivation film formed on the insulating film, the seal ring is formed so as to extend through the insulating film and the passivation film, and the void region further includes another void formed in the passivation film in a region located outside the seal ring when viewed from the element.

With this structure, in the semiconductor device including the passivation film, the void region can prevent cracks and stress generated in a dicing process and transmitted within the passivation film from propagating toward the inside of the chip region.

Preferably, the passivation film has a layered structure of a plurality of films.

With this structure, a film stress of the passivation film can be reduced. Moreover, capacitance can be reduced by forming a part of the films from a low dielectric constant film.

Preferably, the void region includes a plurality of voids discontinuously arranged in a thickness direction of the insulating film.

With this structure, cracks, stress, and the like that are generated in a dicing process can be prevented from reaching the seal ring while suppressing reduction in structural strength of the semiconductor device caused by the void region.

Preferably, the void region includes a plurality of voids arranged so as to be adjacent to each other in a thickness direction of the insulating film.

With this structure, cracks, stress, and the like that are generated in a dicing process can be reliably blocked in a range where the plurality of voids are arranged adjacent to each other in the thickness direction of the insulating film.

Preferably, the void region includes a void formed outside the seal ring when viewed from the element so as to continuously surround the seal ring without a gap.

With this structure, the void region can prevent cracks, stress, and the like that are generated in a dicing process from reaching the seal ring regardless of the propagating direction of the cracks, stress, and the like when viewed from the element.

Preferably, the void region includes a plurality of voids formed outside the seal ring when viewed from the element so as to discontinuously surround the seal ring.

With this structure, a void can be selectively formed in, for example, a region having low impact resistance, and cracks, stress, and the like can be especially prevented from propagating to that region.

Preferably, the semiconductor device further includes at least one other void region including at least one void and formed outside the void region when viewed from the element.

In other words, provided that the void region and the at least one other void region are collectively referred to as a plurality of void regions, it is preferable that the seal ring is at least doubly surrounded by at least two void regions provided outside the seal ring.

With this structure, cracks, stress, and the like can be more reliably prevented from propagating toward the inside of the chip region. In other words, of the plurality of void regions at least doubly surrounding the outside of the seal ring, the void region located closest to a wafer dicing portion (a portion of a dicing region which is to be actually cut by a blade of a dicing device) may not completely absorb cracks, impact, and the like in a dicing process. In this case, even if the cracks, impact, and the like propagate toward the inside of the chip region, there is at least one void region formed inside the outer void region. Therefore, this inner void region can prevent further propagation of cracks, impact, and the like toward the inside of the chip region.

It is preferable that the at least one other void region includes a void formed outside the seal ring when viewed from the element so as to continuously surround the seal ring without a gap.

It is also preferable that the other void region includes a plurality of voids formed outside the seal ring when viewed from the element so as to discontinuously surround the seal ring.

Preferably, each of the void region and the at least one other void region includes a plurality of voids formed outside the seal ring when viewed from the element so as to discontinuously surround the seal ring, and a space between the plurality of voids in the void region and a space between the plurality of voids in the at least one other void region are arranged so as not to be adjacent to each other in a direction perpendicular to an extending direction of the seal ring.

With this structure, since the plurality of void regions are provided so as to at least doubly surround the seal ring, cracks, stress, and the like that are generated in a dicing process can be reliably prevented from propagating toward the inside of the chip region. This effect is obtained because the plurality of void regions are arranged so that a discontinuous portion (a space between the voids) in the outer void region and a discontinuous portion in the inner void region are not adjacent to each other in the direction perpendicular to the extending direction of the seal ring. In other words, even if cracks, stress, and the like are not blocked by the voids located closest to the wafer dicing portion and propagate toward the inside of the chip region through the discontinuous portion of the voids, the cracks, stress, and the like are reliably blocked by the voids in the inner void region.

In other words, when the chip region is viewed from the wafer dicing portion, the voids included in the plurality of void regions at least doubly surrounding the seal ring are arranged without a gap. Therefore, propagation of cracks, impact, and the like from the wafer dicing portion toward the inside of the chip region can be reliably prevented. Since cracks, impact, and the like that are generated during a dicing process can be blocked before reaching the seal ring, the seal ring is neither chipped nor destroyed. As a result, a function of the seal ring to reliably protect the inside of the chip region can be prevented from being degraded.

Preferably, at least one of the plurality of voids arranged so as to surround the seal ring has a different dimension in an extending direction of the seal ring from that of the remainder of the voids.

In other words, it is preferable that the dimension in the extending direction of the seal ring is not uniform in the plurality of voids.

In this case, for example, long voids can be provided in a region to which an impact is likely to be intensively applied, and short voids may be provided in the remaining region. Cracks, impact, and the like which are generated in a dicing process can thus be absorbed in a finely dispersed manner. Since cracks, impact, and the like can be blocked before reaching the seal ring, the seal ring is neither chipped nor destroyed. As a result, a function of the seal ring to reliably protect the inside of the chip region is not degraded.

A method for manufacturing a semiconductor device according to the invention includes the steps of: forming an element on a substrate; forming an interlayer insulating film on the substrate having the element formed thereon; forming in the interlayer insulating film a first recess for forming at least one of an interconnect and a via which are electrically connected to the element, a second recess surrounding the first recess for forming at least a part of a seal ring, and a third recess for forming a void outside the second recess when viewed from the element; and forming at least one of the interconnect and the via and at least a part of the seal ring and leaving the third recess as a void by filling the first recess and the second recess with a conductive film.

According to the method for manufacturing a semiconductor device of the invention, the seal ring surrounds the via and the interconnect which are electrically connected to the element formed on the semiconductor substrate, and the voids are formed outside the seal ring. The semiconductor device manufactured by this manufacturing method has the effects of the semiconductor device of the invention described above.

The via and the interconnect may be integrally formed in the first recess by a dual damascene method.

As has been described above, according to the invention, a semiconductor device includes an element formed on a semiconductor substrate, and a seal ring provided in the periphery of a chip region in which the element is formed and surrounding the element, an interconnect layer, and the like. In this semiconductor device, a void region including at least one void is provided so as to surround the seal ring. Such a void may be formed continuously or discontinuously. A plurality of void regions may be provided so as to at least doubly surround the outside of the seal ring. In the case where a plurality of void regions are provided so as to at least doubly surround the seal ring and a void in each void region is formed discontinuously, it is especially preferable that discontinuous portions of a void region are not adjacent to discontinuous portions of another void region.

The void width may be smaller than the width of an interconnect formed in the chip region. In this case, the void can be prevented from being filled with an interconnect material such as Cu, whereby the void can be easily formed. As a result, an impact that is generated in a dicing process can be reliably blocked. Moreover, since the void width is small, each void has a small occupied area. Even a plurality of voids can therefore be easily formed between the seal ring and a dicing portion. In other words, the degree of freedom in void formation is improved.

With the above-described characteristics of the invention, even when a wafer is chipped, cracked, and the like by a dicing process of obtaining individual chips (semiconductor devices) from the wafer, chippings, cracks, and the like of the wafer can be blocked by a single or double or more void structure before reaching the seal ring. The seal ring can therefore be prevented from being destroyed. As a result, the chip region that will become a semiconductor device can also be prevented from being destroyed, whereby reduction in moisture resistance and reliability of the semiconductor chip can be prevented.

DETAILED DESCRIPTION OF THE PREFERRED EMBODIMENTS

Figure 1:
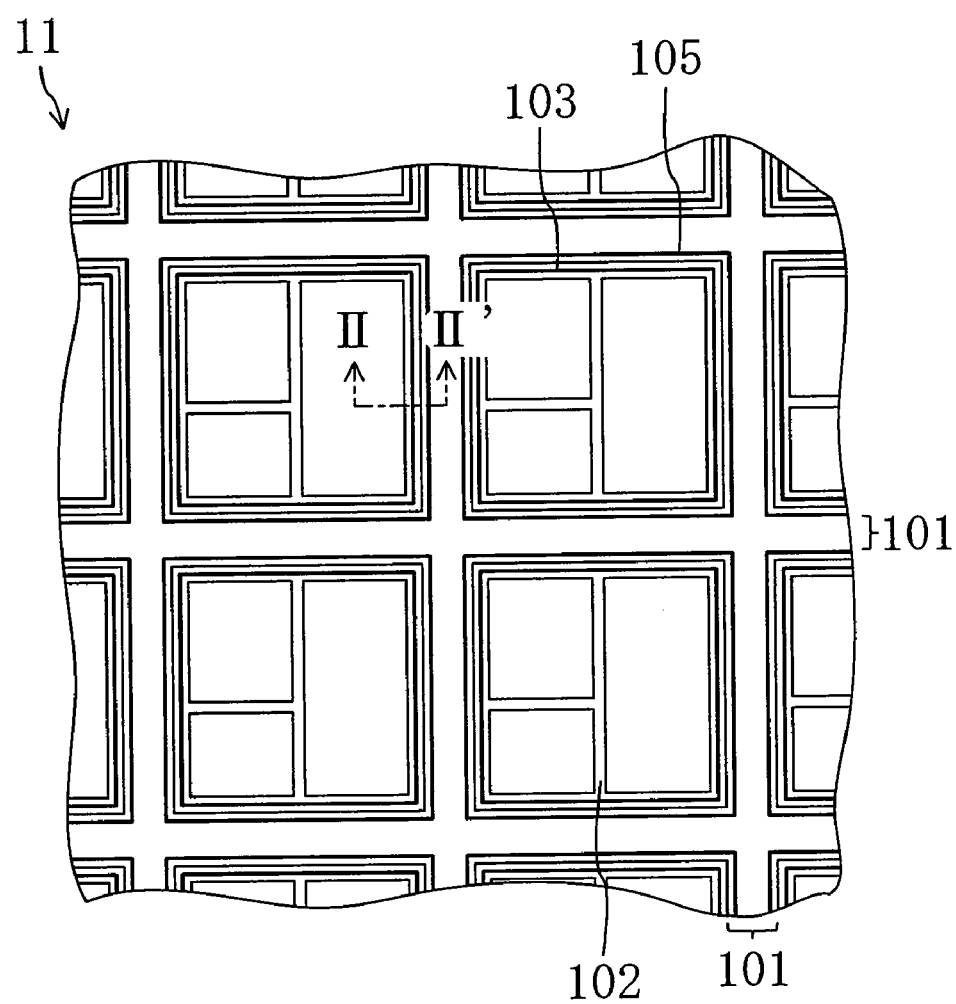
FIG. 1 is a plan view showing a part of a wafer having semiconductor devices of a first embodiment of the invention provided thereon.

Hereinafter, embodiments of the invention will be described with reference to the accompanying drawings.

A first characteristic of the invention is that a seal ring and a void region including at least one void are formed in the same process as the process of forming an interconnect structure. The void in the void region is formed outside the seal ring so as to continuously surround the seal ring without a gap. Therefore, even if cracks, stress, and the like are generated and propagate toward a chip region during a wafer dicing process, they will not reach the seal ring. In other words, since the void is formed outside the seal ring, cracks, stress and the like that are generated in the dicing process are absorbed by the void. Since cracks and the like do not reach the seal ring, the seal ring is not damaged by the cracks and the like. As a result, reduction in reliability of a semiconductor chip resulting from such damage can be avoided (first embodiment).

A second characteristic of the invention is that the void region formed outside the seal ring includes a plurality of voids that are formed discontinuously in parallel with the seal ring. With this structure, stress generated in a dicing process can be absorbed in a finely dispersed manner. Moreover, a void may be selectively formed in a region to which stress is likely to be intensively applied, and the void length may be varied. As a result, cracks and stress which are generated in a dicing process can be prevented from propagating toward a chip, whereby reduction in reliability of the semiconductor chip can be prevented (second embodiment).

A third characteristic of the invention is that the void region formed outside the seal ring includes voids at least doubly surrounding the seal ring. With this structure, even if the void formed on the dicing region side cannot completely absorb cracks and stress that are generated in a dicing process and cannot prevent the cracks and stress from propagating toward a chip, the void formed on the seal ring side can absorb the cracks and stress and prevent propagation thereof. Therefore, the seal ring can be prevented from being damaged, and reduction in reliability of the semiconductor chip can be prevented (third embodiment).

A fourth characteristic of the invention is that the void region formed outside the seal ring includes a plurality of voids at least doubly and discontinuously surrounding the seal ring, and the plurality of voids are formed so that a discontinuous portion in a void is not adjacent to a discontinuous portion in another void. With this structure, when a chip region is viewed from a wafer dicing portion, the voids at least doubly surrounding the seal ring are arranged without a gap. Therefore, the seal ring and the chip region can be more reliably protected as compared to the case where the respective discontinuous portions of the voids doubly surrounding the seal ring are located adjacent to each other (fourth embodiment).

First Embodiment

Hereinafter, a semiconductor device and a manufacturing method thereof according to a first embodiment of the invention will be described with reference to the figures.

FIG. 1 is a plan view showing a part of a wafer having semiconductor devices of the first embodiment provided thereon.

As shown in FIG. 1, a plurality of chip regions 102 that will become semiconductor devices are provided on a wafer that is a semiconductor substrate 11 such as a silicon substrate. An IC (Integrated Circuit) formed by a plurality of elements and having a predetermined function is provided in each chip region 102. The chip regions 102 are separated from each other by a lattice-shaped dicing region 101.

A semiconductor device (i.e., a semiconductor chip) includes a chip region 102 where an IC formed by a plurality of elements and having a predetermined function is provided, a seal ring 103 provided in the periphery of the chip region 102 so as to surround the chip region 102, and a void region 105 of the invention provided outside the seal ring 103 so as to surround the seal ring 103. A semiconductor wafer having a plurality of semiconductor devices formed thereon is diced along the dicing region 101 into individual semiconductor devices after each chip is completed.

The void region 105 is provided in order to reduce an impact, stress, and the like which are applied to the seal ring 103 during a dicing process. The dicing process therefore has to be performed outside the void region 105 when viewed from the seal ring 103 side.

Figure 2:
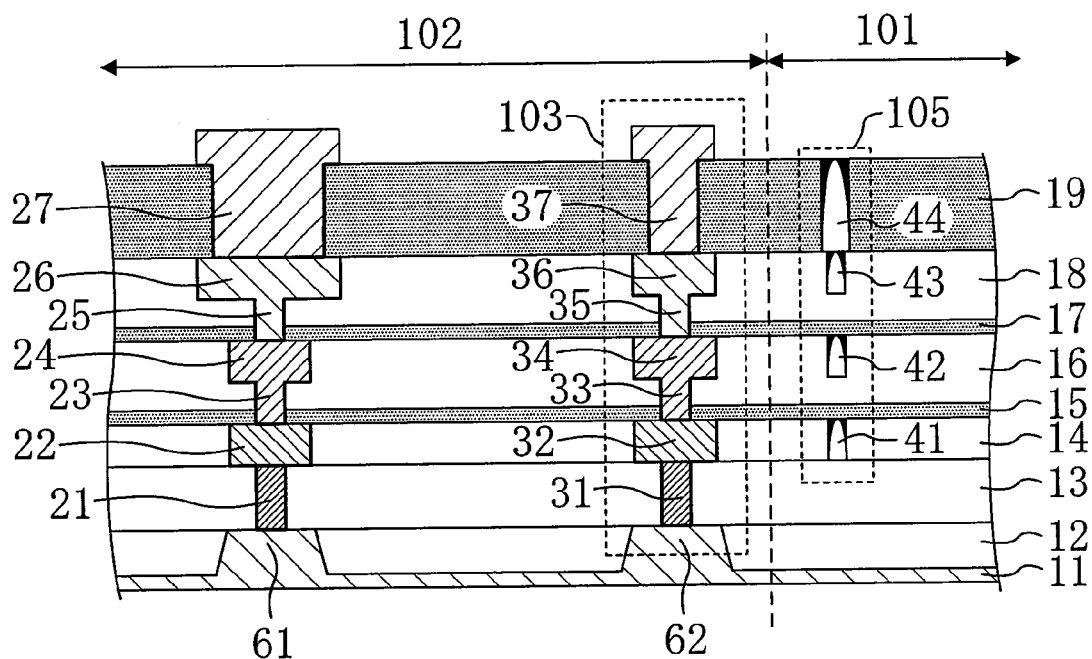
FIG. 2 is a cross-sectional view taken along line II-II' in FIG. 1.
Figure 3:
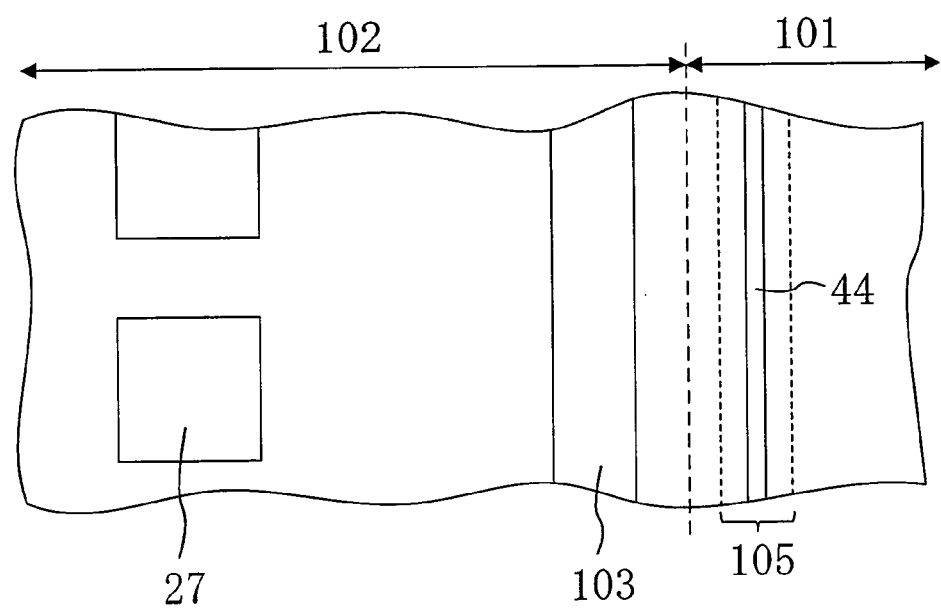
FIG. 3 is an enlarged plan view showing a region around line II-II' in FIG. 1.

FIG. 2 is a cross-sectional view taken along line II-II' in FIG. 1. In other words, FIG. 2 is a cross-sectional view of a region around an end portion of a semiconductor device including a seal ring 103 located in the periphery of a chip region 102 and a void region 105 (more specifically, an interconnection structure of the chip region 102, a structure of the seal ring 103, and the void region 105). FIG. 3 is an enlarged plan view showing a region near line II-II' in FIG. 1.

As shown in FIGS. 2 and 3, a semiconductor device before dicing includes a dicing region 101 and a chip region 102. An element isolation film 12, an insulating film (first through sixth interlayer insulating films 13 through 18), and a passivation film 19 are formed on a semiconductor substrate 11 (hereinafter, simply referred to as substrate 11). A seal ring 103 including first, second, and third seal vias 31, 33, and 35 and first, second, and third seal interconnects 32, 34, and 36 is formed in the insulating film near the boundary with the dicing region 101 in the chip region 102. A void region 105 including first through fourth voids 41 through 44 is formed outside the seal ring 103 (near the boundary with the chip region 102 in the dicing region 101). An interconnection structure including first, second, and third vias 21, 23, and 25 and first, second, and third interconnects 22, 24, and 26 is formed inside the seal ring 103 in the chip region 102. A pad 27 and a cap 37 are formed in the passivation film 19. The pad 27 is formed on the third interconnect 26 and the cap 37 is formed on the third seal interconnect 36.

A manufacturing method of a semiconductor device having the structure shown in FIGS. 2 and 3 will now be described with reference to the corresponding figures.

Figure 4A:
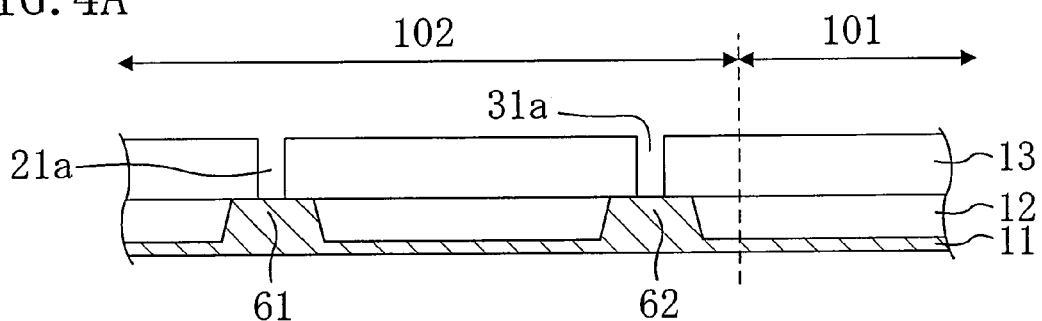
FIGS. 4A, 4B, 4C, and 4D are cross-sectional views illustrating the steps of a method for manufacturing a semiconductor device according to the first embodiment.

First, as shown in FIG. 4A, an element isolation film 12 is formed on a semiconductor substrate 11. An active layer 61 that forms an element such as a transistor is formed in the substrate 11 in a chip region 102, and a conductive layer 62 having the same structure as that of the active layer 61 is formed in the substrate 11 in the periphery of the chip region 102 (in a seal ring formation region near a dicing region 101).

A first interlayer insulating film 13 is then deposited over the substrate 11. Thereafter, a via hole 21a for forming a first via 21 on the active layer 61 is formed in the first interlayer insulating film 13 in the chip region 102 by using a lithography method and a dry etching method. At the same time, a first seal via hole 31a for forming a first seal via 31 on the conductive layer 62 is formed in the first interlayer insulating film 13 in the seal ring formation region. A "seal via" herein indicates a part that forms a seal ring, and is formed by filling a groove continuously surrounding the chip region with a conductive material. The seal via has a line-shaped structure having approximately the same width as that of a via in the chip region.

Note that, in this embodiment, the seal via hole 31a for forming the first seal via 31 is formed simultaneously with the via hole 21a formed in the first interlayer insulating film 13 in the chip region 102. However, the via hole 21a and the seal via hole 31a may be formed separately.

Figure 4B:
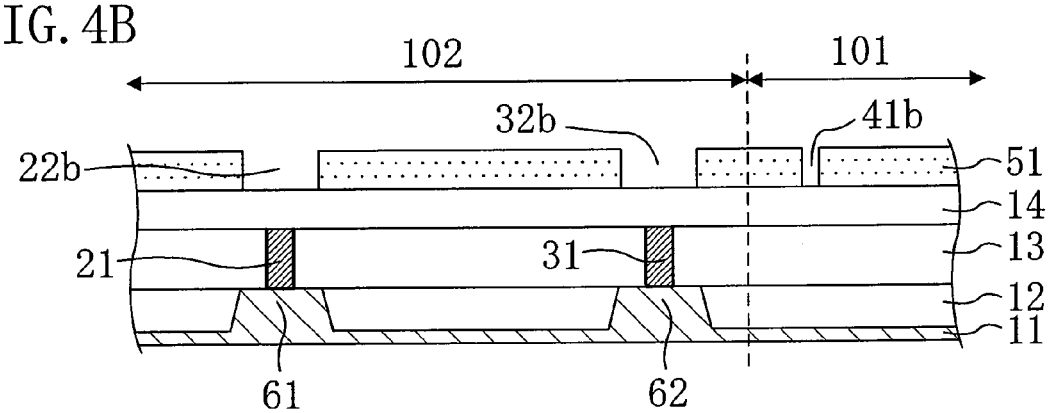

Next, the step shown in FIG. 4B is performed. First, a barrier metal such as titanium (Ti) or titanium nitride (TiN) is formed in the first via hole 21a and the first seal via hole 31a. The first via hole 21a and the first seal via hole 31a are then filled with a metal such as tungsten (W), and excessive barrier metal and metal are removed by a CMP (Chemical Mechanical Polishing) method. A first via 21 and a first seal via 31 are thus formed.

A second interlayer insulating film 14 is then formed on the first interlayer insulating film 13. A resist 51 having an interconnect groove pattern 22b for forming an interconnect groove in the second interlayer insulating film 14, a seal interconnect groove pattern 32b for forming a seal interconnect groove in the second interlayer insulating film 14, and a first void formation pattern 41b for forming a first void 41 in the second interlayer insulating film 14 is then formed by using a lithography method. A "seal interconnect" herein indicates a part that forms the seal ring 103, and is formed by filling a groove continuously surrounding the chip region 102 with a conductive material.

It is desirable to form the first void formation pattern 41b with a dimension smaller than the smallest width of the interconnect groove pattern 22b. For example, provided that X is the smallest width of the interconnect groove pattern 22b, the width of the first void formation pattern 41b is 0.8×. The reason for this will be described later.

Figure 4C:
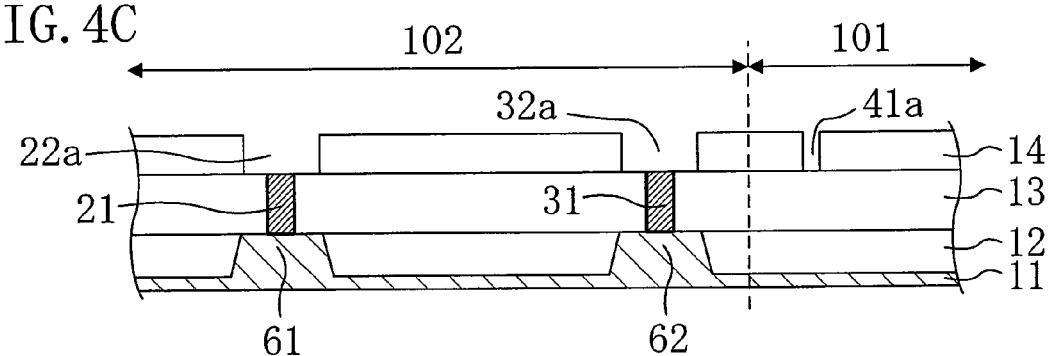

Next, as shown in FIG. 4C, a first interconnect groove 22a for forming a first interconnect 22 is formed in the second interlayer insulating film 14 in the chip region 102 by a dry etching method so as to connect to the first via 21. At the same time, a first seal interconnect groove 32a for forming a first seal interconnect 32 is formed in the second interlayer insulating film 14 in the seal ring formation region so as to connect to the first seal via 31. Moreover, a first void formation groove 41a for forming a first void 41 is formed in the second interlayer insulating film 14 in the dicing region 101.

Figure 4D:
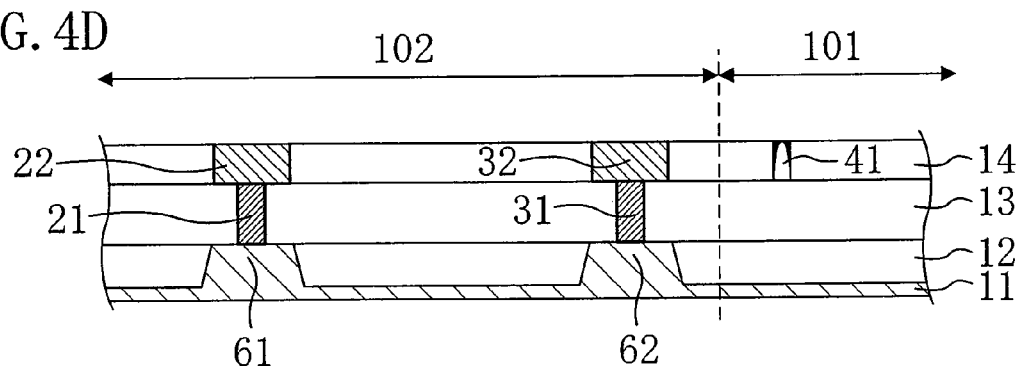

The step shown in FIG. 4D is then performed. First, a barrier metal such as tantalum (Ta) or tantalum nitride (TaN) is formed in the first interconnect groove 22a and the first seal interconnect groove 32a by a sputtering method. A metal film made of copper (Cu) is then formed by a plating method, and the barrier metal and Cu which overflow from the first interconnect groove 22a and the first seal interconnect groove 32a are removed by a CMP method. A first interconnect 22 and a first seal interconnect 32 are thus formed in the second interlayer insulating film 14 in the chip region 102.

The first void formation groove 41a has a dimension smaller than the smallest dimension of the interconnect pattern and therefore has a narrow opening width. The barrier metal is therefore only partially formed in the first void formation groove 41a or the opening is blocked. As a result, metal plating such as Cu is not formed inside the first void formation groove 41a, and a first void 41 can be formed in the second interlayer insulating film 14 in the dicing region 101.

Figure 5A:
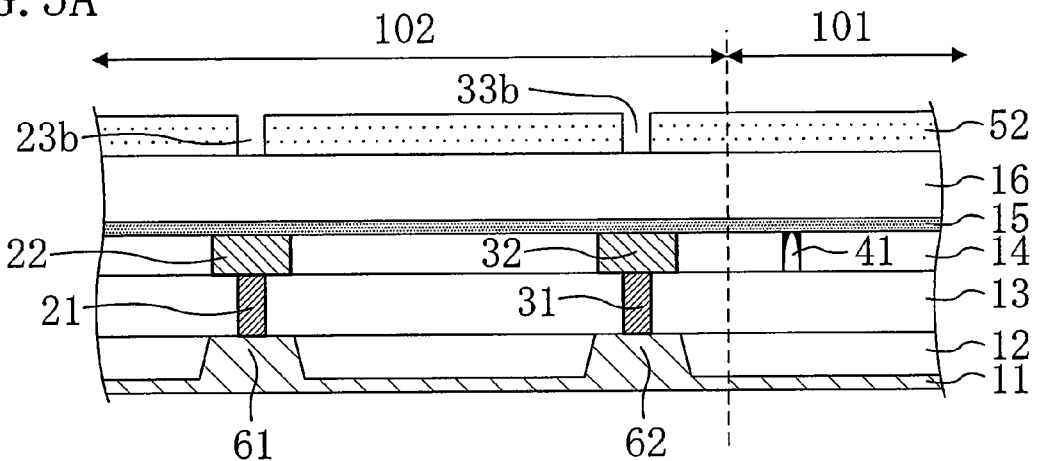
FIGS. 5A, 5B, and 5C are cross-sectional views illustrating the steps after FIG. 4D of the method for manufacturing a semiconductor device according to the first embodiment.

As shown in FIG. 5A, a third interlayer insulating film 15 and a fourth interlayer insulating film 16 are then sequentially formed on the second interlayer insulating film 14. A via pattern formation resist 52 having a second via hole pattern 23b for forming a second via hole 23a in the fourth interlayer insulating film 16 and a second seal via pattern 33b for forming a second seal via hole 33a in the fourth interlayer insulating film 16 is formed by using a lithography method.

Figure 5B:
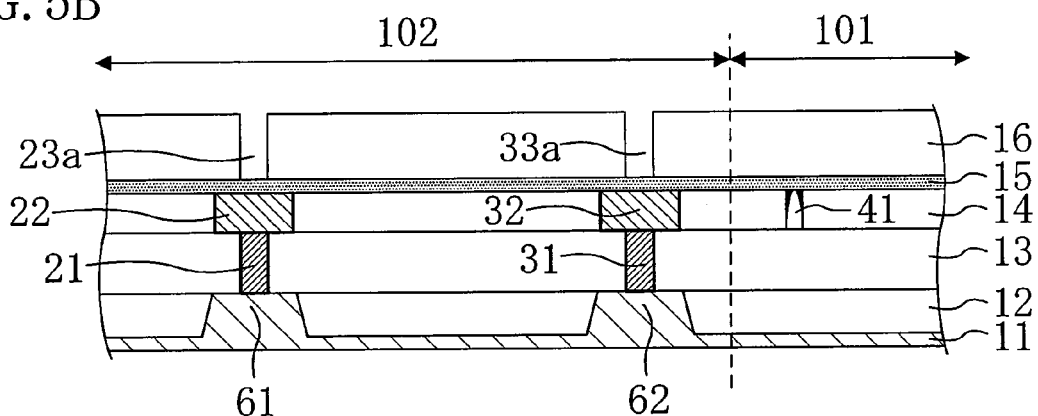

As shown in FIG. 5B, a second via hole 23a for forming a second via 23 connecting to the first interconnect 22 is then formed in the fourth interlayer insulating film 16 in the chip region 102 by using a dry etching method. At the same time, a second seal via hole 33a for forming a second seal via 33 connecting to the first seal interconnect 32 is formed in the fourth interlayer insulating film 16 in the seal ring formation region. The via pattern formation resist 52 is then removed by ashing and cleaning.

Figure 5C:
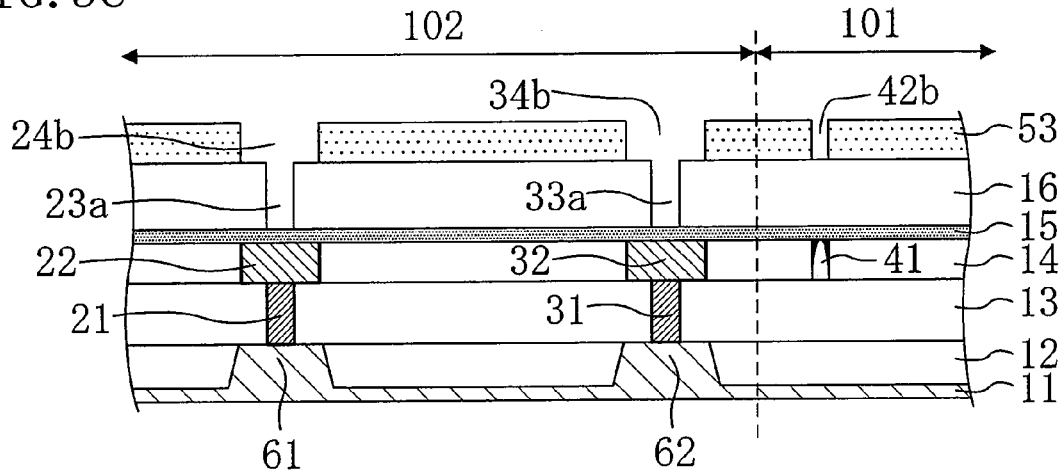

As shown in FIG. 5C, a resist 53 having a second interconnect groove pattern 24b for forming a second interconnect groove 24a in the fourth interlayer insulating film 16, a second seal interconnect groove pattern 34b for forming a second seal interconnect groove 34a in the fourth interlayer insulating film 16, and a second void formation pattern 42b for forming a second void formation groove 42a in the fourth interlayer insulating film 16 is formed by using a lithography method.

It is desirable to form the second void formation pattern 42b with a dimension smaller than the smallest width (x) of the second interconnect groove pattern 24b, for example, with a width of 0.8x or less.

Figure 6A:
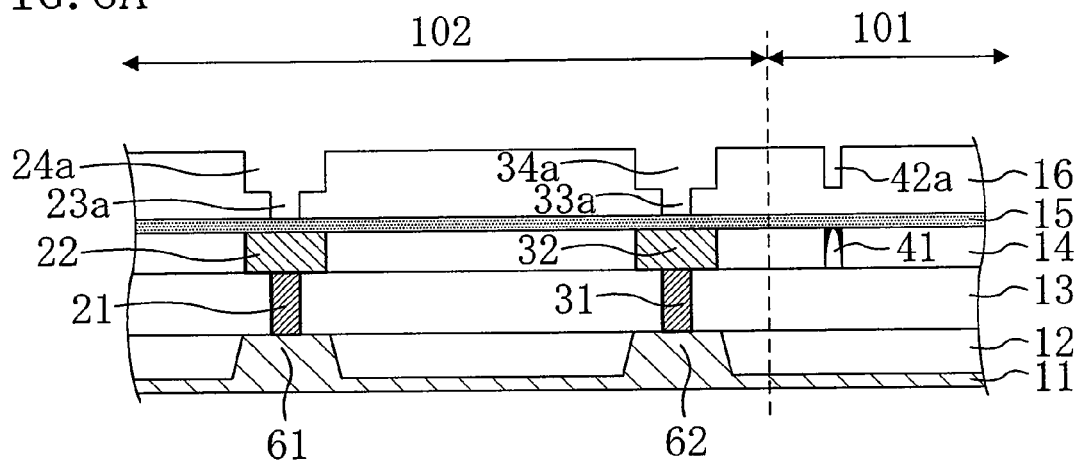
FIGS. 6A, 6B, and 6C are cross-sectional views illustrating the steps after FIG. 5C of the method for manufacturing a semiconductor device according to the first embodiment.

Next, the step shown in FIG. 6A is performed. A second interconnect groove 24a for forming a second interconnect 24 is formed in the fourth interlayer insulating film 16 in the chip region 102 by a dry etching method so as to connect to the via hole 23a. At the same time, a second seal interconnect groove 34a for forming a second seal interconnect 34 is formed in the fourth interlayer insulating film 16 in the seal ring formation region so as to connect to a second seal via hole 33a. Moreover, a second void formation groove 42a for forming a second void 42 is formed in the fourth interlayer insulating film 16 in the dicing region 101. The resist 53 is then removed by ashing and cleaning.

Figure 6B:
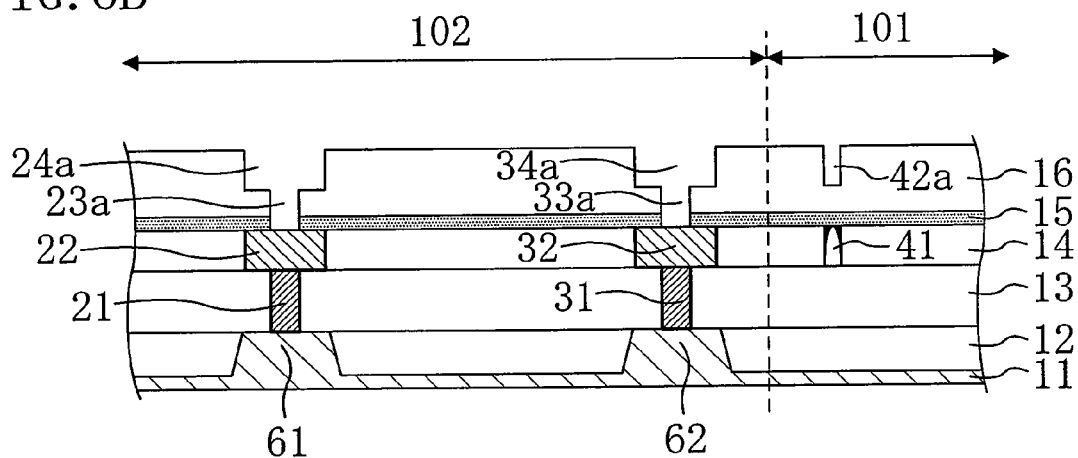

As shown in FIG. 6B, a part of the third interlayer insulating film 15 which is located on the first interconnect 22 and the first seal interconnect 32 is removed by using a dry etching method. The top of the first interconnect 22 and the top of the first seal interconnect 32 are thus exposed.

Figure 6C:
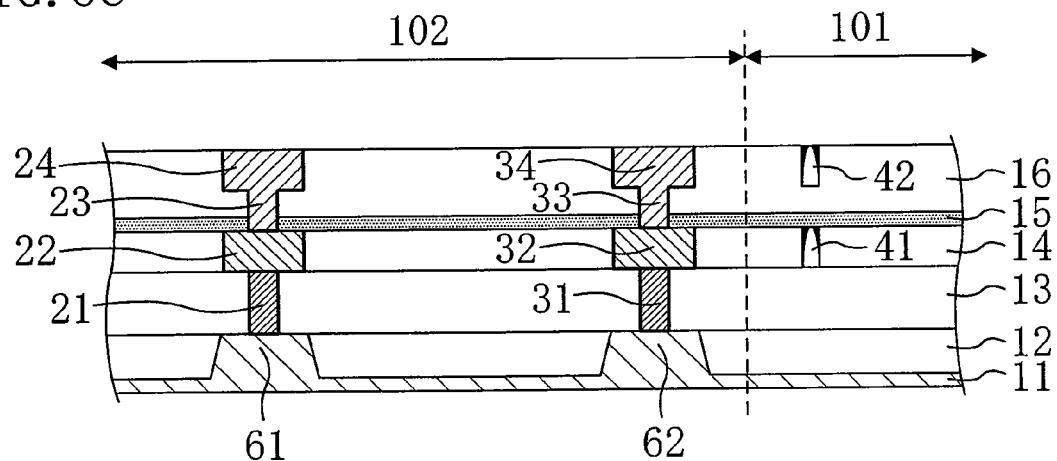

Next, the step of FIG. 6C is performed. A barrier metal such as Ta or TaN is formed in the second via hole 23a and the second interconnect groove 24a and in the second seal via hole 33a and the second seal interconnect groove 34a by a sputtering method, and a metal film made of Cu is formed by a plating method. An overflow portion of the barrier metal and Cu are then removed by a CMP method. A second via 23, a second interconnect 24, a second seal via 33, and a second seal interconnect 34 are thus formed in the fourth interlayer insulating film 16 in the chip region 102. In other words, a via, an interconnect, a seal via, and a seal interconnect are formed by using a dual damascene method of simultaneously filling a via hole and an interconnect groove with a metal.

Since the opening width 0.8x of the second void formation groove 42a is smaller than the smallest dimension x of the interconnect pattern, the barrier metal is only partially formed in the second void formation groove 42a or the opening is blocked. Metal plating such as Cu is therefore not formed inside the second void formation groove 42a. As a result, a second void 42 can be formed in the fourth interlayer insulating film 16 in the dicing region 101.

Figure 7A:
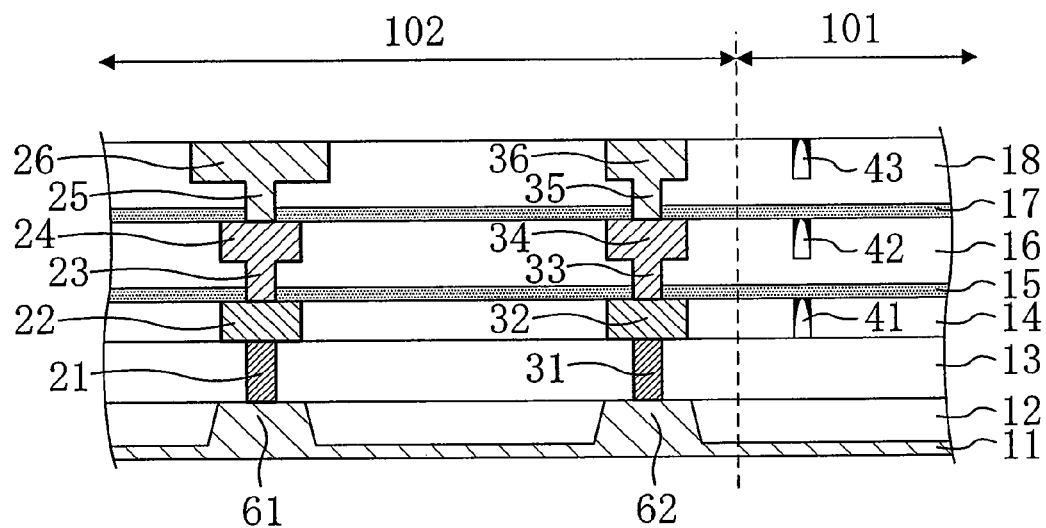
FIGS. 7A and 7B are cross-sectional views illustrating the steps after FIG. 6C of the method for manufacturing a semiconductor device according to the first embodiment.

Next, the step shown in FIG. 7A is performed. First, a fifth interlayer insulating film 17 and a sixth interlayer insulating film 18 are sequentially formed on the fourth interlayer insulating film 16. By using the same method as that shown in FIGS. 5A through 5C and FIGS. 6A through 6C, a third via 25 is formed in the fifth and sixth interlayer insulating films 17 and 18 and a third interconnect 26 is formed in the sixth interlayer insulating film 18 in the chip region 102. At the same time, a third seal via 35 is formed in the fifth and sixth interlayer insulating films 17 and 18 and a third seal interconnect 36 is formed in the sixth interlayer insulating film 18 in the seal ring formation region. Moreover, a third void 43 is formed in the sixth interlayer insulating film 18 in the dicing region 101.

Figure 7B:
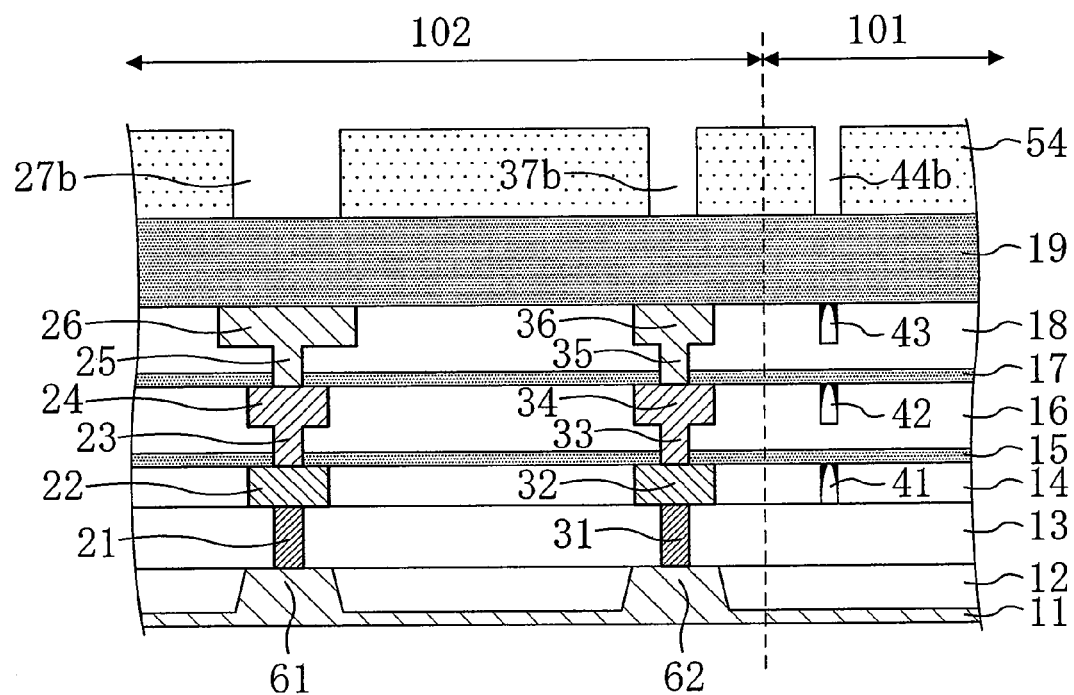

The step shown in FIG. 7B is then performed. First, a passivation film 19 is formed on the sixth interlayer insulating film 18. In an example of this embodiment, the sixth interlayer insulating film 18 will become a topmost interconnect layer and the passivation film 19 will become a protective film of this interconnect layer. A passivation film processing resist 54 having a pad groove pattern 27b for forming a pad opening 27a in the passivation film 19, a cap groove formation pattern 37b for forming a cap groove 37a in an upper portion of the seal ring in the passivation film 19, and a forth void formation pattern 44b for forming a fourth void formation groove 44a in the passivation film 19 is formed by using a lithography method.

Note that it is desirable to form the forth void formation pattern 44b with a dimension narrower than the smallest width (x) of the pad groove pattern 27b and the cap groove formation pattern 37b, for example, with a dimension of 0.8x or less.

Figure 8A:
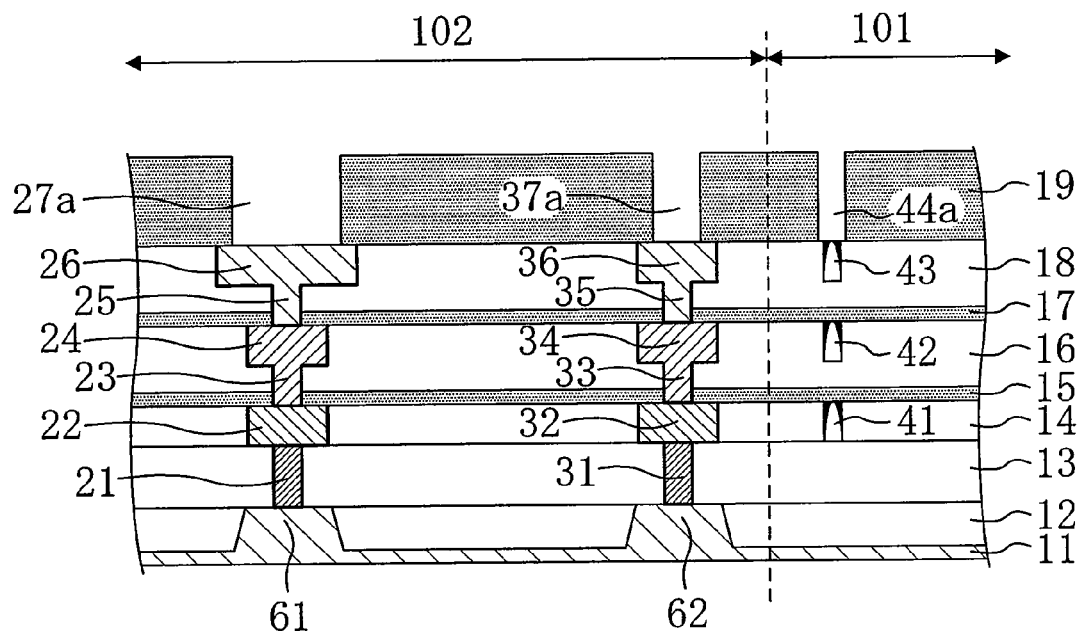
FIGS. 8A and 8B are cross-sectional views illustrating the steps after FIG. 7B of the method for manufacturing a semiconductor device according to the first embodiment.

As shown in FIG. 8A, a pad groove 27a for forming a pad 27 connecting to the third interconnect 26 is then formed in the passivation film 19 in the chip region 102 by using a dry etching method. At the same time, a cap groove 37a for forming a cap 37 connecting to the third seal interconnect 36 is formed in the passivation film 19 in the seal ring formation region. Moreover, a fourth void formation groove 44a for forming a fourth void 44 is formed in the passivation film 19 in the dicing region 101. The resist 54 is then removed by ashing and cleaning.

Figure 8B:
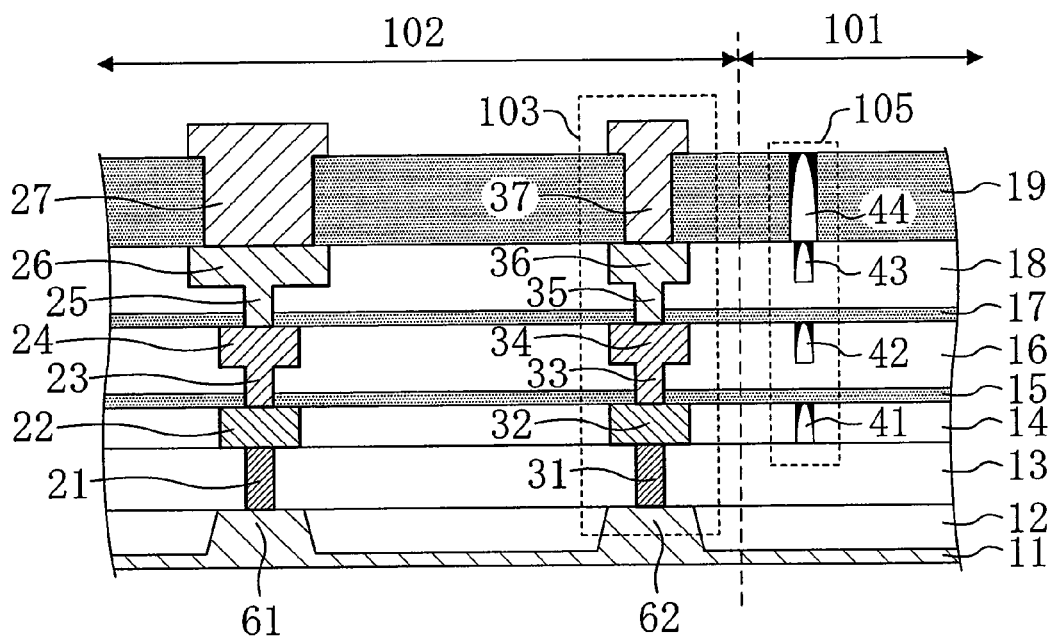

Next, the step shown in FIG. 8B is performed. A barrier metal such as Ta or TaN and a metal film such as aluminum (Al) are sequentially formed in the pad groove 27a and the cap groove 37a. The barrier metal and the metal film are then patterned by a lithography method and a dry etching method, whereby a pad 27 and a cap 37 are formed.

Since the forth void formation groove 44a has a narrow opening width, the barrier metal is only partially formed inside the fourth void formation groove 44a or the opening is blocked. As a result, a fourth void 44 can be formed in the passivation film 19 in the dicing region 101.

Formation of a plurality of semiconductor devices on the substrate 11 (wafer) is thus completed by the above process. By the above manufacturing method of a semiconductor device, the first, second, and third seal vias 31, 33, and 35, the first, second, and third seal interconnects 32, 34, and 36, and the cap 37 are sequentially formed simultaneously with the first, second, and third vias 21, 23, and 25, the first, second, and third interconnects 22, 24, and 26, and the pad 27 in the chip region 102, respectively. The seal ring 103 can thus be formed. Moreover, the void region 105 in which the first, second, third, and fourth voids 41, 42, 43, and 44 are discontinuously arranged in the layered direction of the interlayer insulating films can be formed outside the seal ring 103. By setting the width of the first, second, third, and fourth void formation grooves 41a, 42a, 43a, and 44a, each void can be formed simultaneously in the step of forming a corresponding interconnect and a corresponding seal interconnect. The semiconductor device of this embodiment can thus be manufactured without the need to provide an additional step of forming the voids.

The semiconductor device of this embodiment has the following effects: the substrate 11, that is, a wafer having a plurality of semiconductor devices formed thereon, is diced along the dicing region 101 (see FIG. 1) into individual semiconductor devices (semiconductor chips). In the dicing process, an impact, stress, and the like, or cracks resulting from the impact, stress, and the like are generated in a dicing portion and propagate toward the chip region 102. However, such an impact, stress, cracks, and the like are absorbed in the void region 105. In other words, the void region 105 prevents further propagation of the impact, stress, cracks, and the like toward the chip region 102. The seal ring 103 is therefore not damaged, whereby one of original functions of the seal ring 103, that is, a function to prevent the entry of moisture, mobile ions, and the like from outside into the chip region 102, can be retained. A reliable semiconductor device can thus be obtained.

A semiconductor device of this embodiment having a void formation groove filled with a metal is herein referred to as a comparative example. The reason why the semiconductor device of this embodiment is superior to the comparative example will now be described.

In the comparative example, a void formation groove (corresponding to the fourth void formation groove 44a) formed in the passivation film is filled with a metal. In this comparative example, the metal may partially collapse due to an impact that is generated during a dicing process and may be exposed at the surface of the passivation film. If the semiconductor device in such a state is packaged, the exposed metal is brought into contact with bonding wires, resulting in a product defect. In the case where the void formation groove formed in the passivation film is not filled with a metal (i.e., in the case of this embodiment), on the other hand, the metal will not be exposed at the surface of the passivation film due to an impact that is generated during a dicing process. The semiconductor device having the void formation groove not filled with a metal is thus superior to that having the void formation groove filled with a metal.

Moreover, if the first, second, and third void formation grooves 41a, 42a, and 43a are filled with a metal, the insulating film may collapse and may be exposed during a dicing process. This also results in a product defect, as described above. It is therefore better for the first, second, and third void formation grooves 41a, 42a, and 43a as well not to be filled with a metal as in this embodiment.

Note that the above description applies to second through fourth embodiments described below.

In the semiconductor device of the first embodiment, a void (41, 42, 43) surrounding a seal interconnect (32, 34, 36) is formed in order to reliably protect an interconnect (22, 24, 26) and a seal interconnect. In order to reduce a dielectric constant between interconnects, a low dielectric constant insulating film is often used for a layer in which an interconnect is formed. In order to provide the effect of the void region 105, it is important to reliably protect a seal interconnect provided at a level where an interconnect is formed. It is more desirable in terms of impact absorption during a dicing process to form a void at a level where an interconnect and a seal interconnect are formed than to form a void only at a level where a via (21, 23, 25) and a seal via (31, 33, 35) are formed (for example, Japanese Laid-Open Patent Publication No. 2006-59976; hereinafter, referred to as Patent document 3). Note that a "level" herein indicates a space included in the range from the height of the bottom surface to the height of the top surface of a via, seal via, an interconnect, and a seal interconnect.

It is preferable that the groove width of a void (41, 42, 43) is smaller than the width of an interconnect (22, 24, 26) (especially the width of an interconnect having the smallest width). In this case, the void can be prevented from being filled with an interconnect material such as Cu, whereby the void can be easily formed. As a result, an impact that is generated in a dicing process can be reliably blocked. Moreover, each void has a narrow width and therefore has a small occupied area. Even a plurality of voids can therefore be easily formed between a seal ring and a dicing portion. In other words, the degree of freedom in design for void formation is improved.

The above description also applies to second to fourth embodiments described below.

Second Embodiment

Hereinafter, a semiconductor device and a manufacturing method thereof according to a second embodiment of the invention will be described with reference to the figures.

Figure 9:
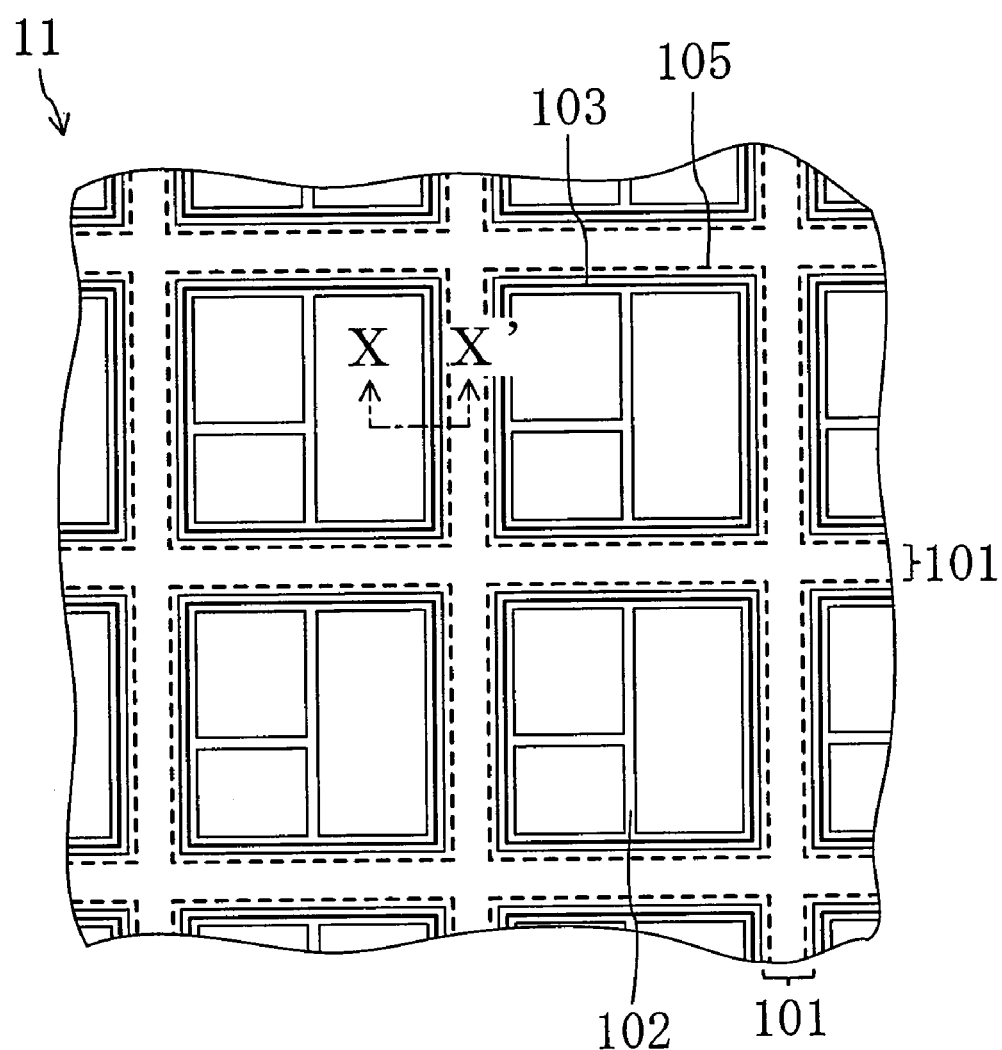
FIG. 9 is a plan view showing a part of a wafer having semiconductor devices of a second embodiment of the invention provided thereon.

FIG. 9 is a plan view showing a part of a wafer having semiconductor devices of the second embodiment provided thereon.

As shown in FIG. 9, a plurality of chip regions 102 that will become semiconductor devices are provided on a wafer that is a semiconductor substrate 11 such as a silicon substrate. An IC formed by a plurality of elements and having a predetermined function is provided in each chip region 102. The chip regions 102 are separated from each other by a lattice-shaped dicing region 101.

A semiconductor device (i.e., a semiconductor chip) includes a chip region 102 where an IC formed by a plurality of elements and having a predetermined function is provided, a seal ring 103 provided in the periphery of the chip region 102 so as to surround the chip region 102, and a void region 105 of the invention provided outside the seal ring 103 so as to surround the seal ring 103. The void region 105 includes a plurality of voids discontinuously arranged in a direction parallel to the seal ring 103. The semiconductor substrate 11 having a plurality of semiconductor devices formed thereon is diced along the dicing region 101 into individual semiconductor devices after each chip is completed.

The void region 105 is provided in order to reduce an impact, stress, and the like which are applied to the seal ring 103 during a dicing process. The dicing process therefore has to be performed outside the void region 105 when viewed from the seal ring 103 side.

Figure 10:
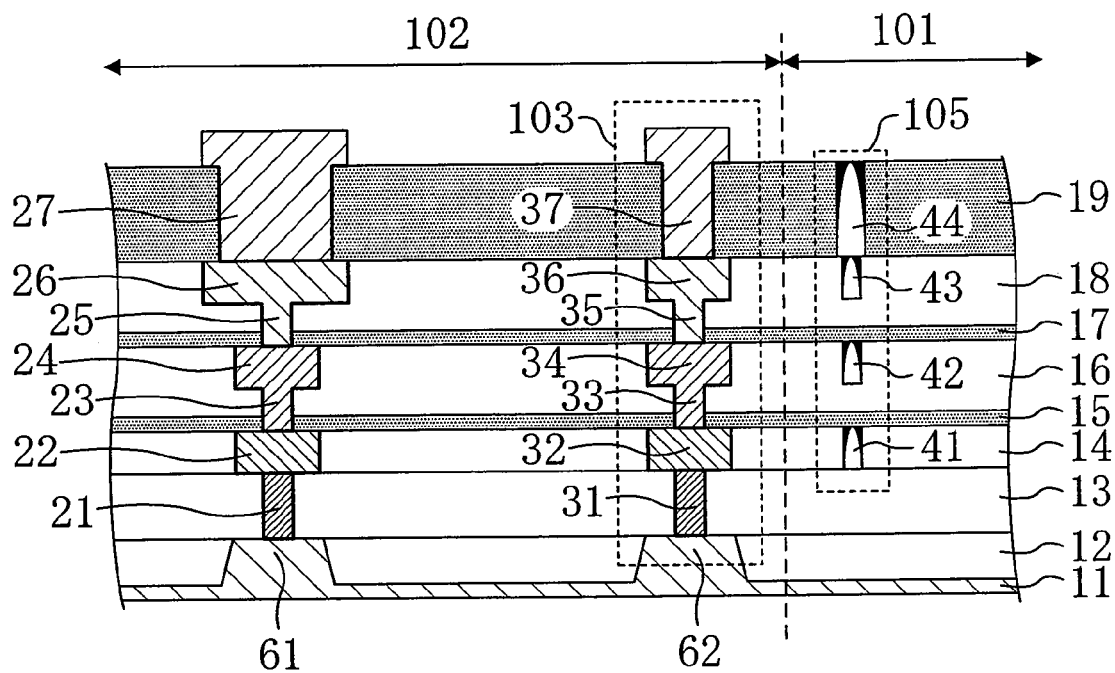
FIG. 10 is a cross-sectional view taken along line X-X' in FIG. 9.
Figure 11:
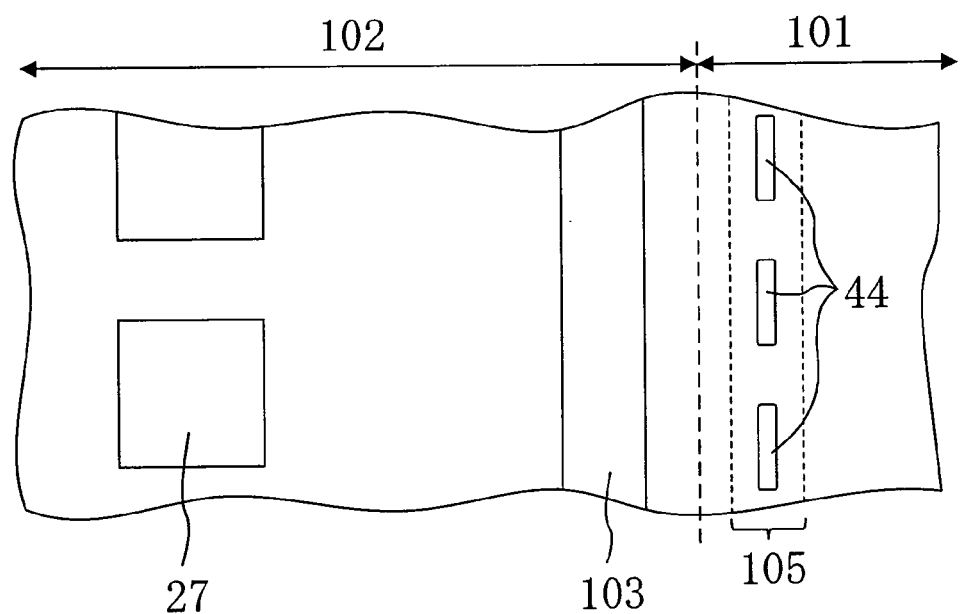
FIG. 11 is an enlarged plan view showing a region around line X-X' in FIG. 9.

FIG. 10 is a cross-sectional view taken along line X-X' in FIG. 9. In other words, FIG. 10 is a cross-sectional view of a region around an end portion of a semiconductor device including a seal ring 103 located in the periphery of a chip region 102 and a void region 105 (more specifically, an interconnection structure of the chip region 102, a structure of the seal ring 103, and the void region 105). FIG. 11 is an enlarged plan view showing a region near line X-X' in FIG. 9.

As shown in FIGS. 9 through 11, a semiconductor device before dicing includes a dicing region 101 and a chip region 102. A seal ring 103 is formed near the boundary with the dicing region 101 in the chip region 102. A void region 105 including a plurality of voids discontinuously arranged in parallel with the seal ring 103 is formed outside the seal ring 103 (near the boundary with the chip region 102 in the dicing region 101).

As described above, the semiconductor device of the second embodiment has the same structure as that of the semiconductor device of the first embodiment except that the plurality of voids that are included in the void region 105 formed in parallel with the seal ring 103 are discontinuously arranged in a length direction outside the seal ring 103. The same method as the manufacturing method of a semiconductor device of the first embodiment as described above with reference to FIGS. 4A through 4D, 5A through 5C, 6A through 6C, 7A and 7B, and 8A and 8B can be used as a manufacturing method of a semiconductor device of the second embodiment by changing a lithography mask for forming a void formation groove pattern.

The semiconductor device according to the second embodiment of the invention has the following effects: the substrate 11, that is, a wafer having semiconductor devices formed thereon, is diced along the dicing region 101 into individual semiconductor devices (semiconductor chips). In the dicing process, an impact, stress, or the like, or cracks resulting from the impact, stress, or the like are generated in a dicing portion and propagate toward the chip region 102. However, such an impact, stress, cracks, or the like can be absorbed by the discontinuously arranged voids in a finely dispersed manner. The voids can be selectively arranged in a region to which a stress is likely to be intensively applied, or the length of the voids can be changed. As a result, cracks and stress which are generated in a dicing process can be absorbed and can be prevented from propagating toward a chip. The seal ring 103 is therefore not damaged, whereby one of original functions of the seal ring 103, that is, a function to prevent the entry of moisture, mobile ions, and the like from outside into the chip region 102, can be retained. A reliable semiconductor device can thus be manufactured.

Third Embodiment

Hereinafter, a semiconductor device and a manufacturing method thereof according to a third embodiment of the invention will be described with reference to the figures.

Figure 12:
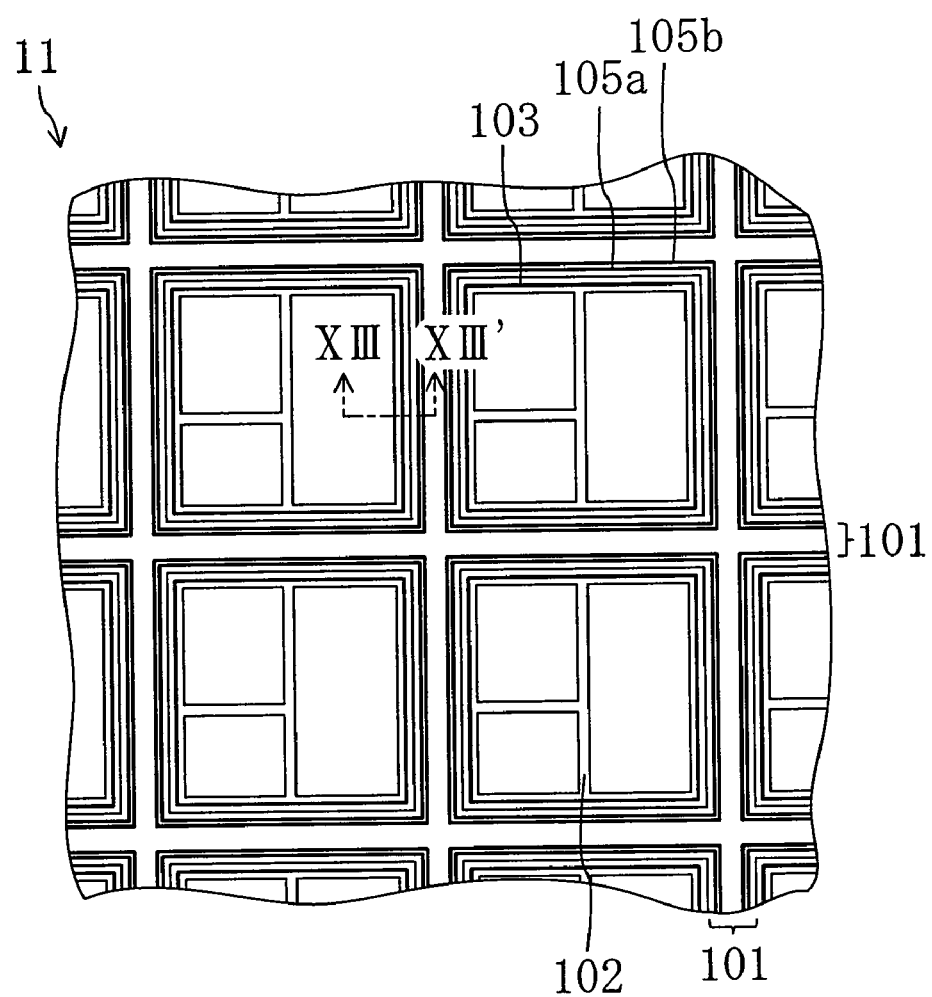
FIG. 12 is a plan view showing a part of a wafer having semiconductor devices of a third embodiment of the invention provided thereon.

FIG. 12 is a plan view showing a part of a wafer having semiconductor devices of the third embodiment (semiconductor devices each having void regions doubly surrounding a chip region) provided thereon.

As shown in FIG. 12, a plurality of chip regions 102 that will become semiconductor devices are provided on a wafer (semiconductor substrate 11) such as a silicon substrate. An IC formed by a plurality of elements and having a predetermined function is provided in each chip region 102. The chip regions 102 are separated from each other by a lattice-shaped dicing region 101.

A semiconductor device (i.e., a semiconductor chip) includes a chip region 102 where an IC formed by a plurality of elements and having a predetermined function is provided, a seal ring 103 provided in the periphery of the chip region 102 so as to surround the chip region 102, and a plurality of void regions 105a and 105b provided outside the seal ring 103 so as to surround the seal ring 103. The semiconductor device of the third embodiment has the same structure as that of the semiconductor device of the first embodiment except that the void region has a double structure. In other words, in the third embodiment, an additional void region 105b is provided outside the void region 105a corresponding to the void region 105 in FIG. 2. In this embodiment, the void region may have a more than double structure (e.g., a triple or quadruple structure) if the layout allows.

Figure 13:
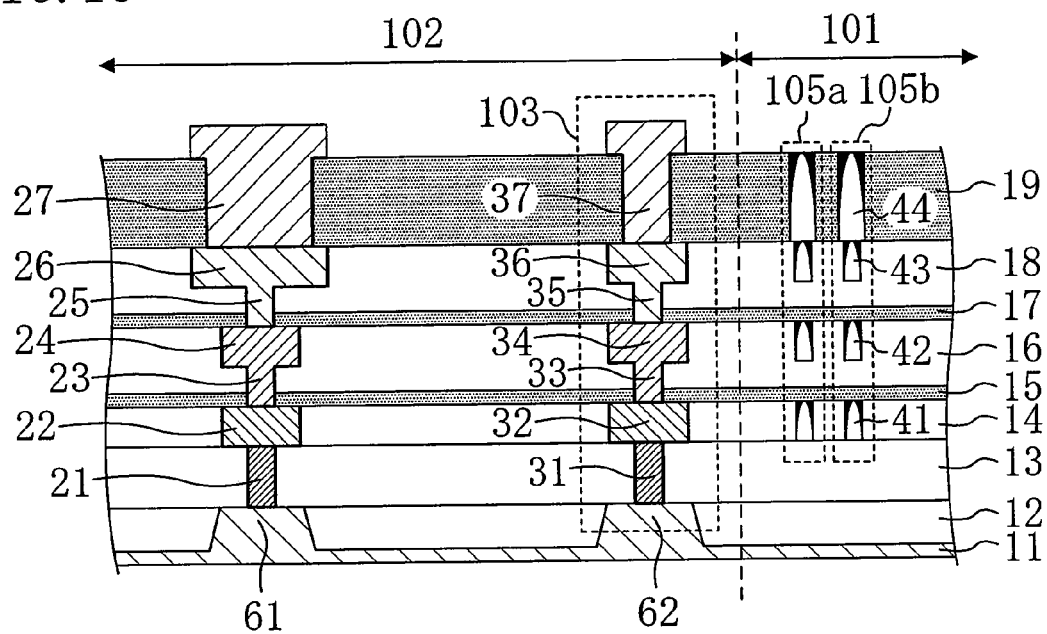
FIG. 13 is a cross-sectional view taken along line XIII-XIII' in FIG. 12.
Figure 14:
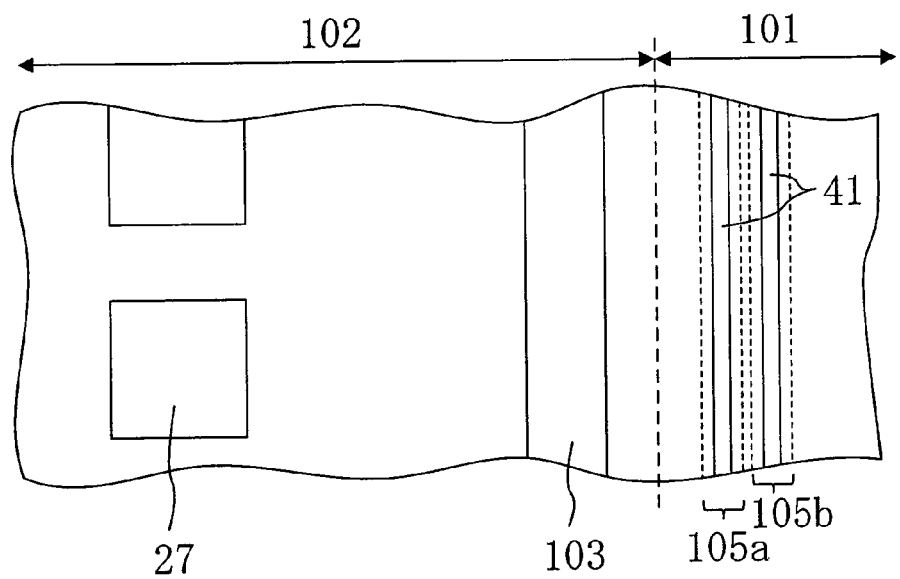
FIG. 14 is an enlarged plan view showing a region around line XIII-XIII' in FIG. 12.

FIG. 13 is a cross-sectional view taken along line XIII-XIII' in FIG. 12. FIG. 14 is an enlarged plan view showing a region near line XIII-XIII' in FIG. 12.

As shown in FIGS. 12 through 14, a semiconductor device before dicing includes a dicing region 101 and a chip region 102. A seal ring 103 is formed near the boundary with the dicing region 101 in the chip region 102. Void regions 105a and 105b are formed outside the seal ring 103 (near the boundary with the chip region 102 in the dicing region 101) so as to doubly surround the seal ring 103.

A manufacturing method of a semiconductor device of the third embodiment is the same as the manufacturing method of a semiconductor device of the first embodiment except the layout of a double-structure void formation mask pattern in a photomask to be used.

According to the manufacturing method of a semiconductor device of the third embodiment, a seal ring 103 including first, second, and third seal vias 31, 33, and 35 and first, second, and third seal interconnects 32, 34, and 36 can be formed simultaneously with first, second, and third vias 21, 23, and 25 and first, second, and third interconnects 22, 24, and 26 in the chip region 102. Moreover, a void region having a double structure (void regions 105a and 105b) can be formed outside the seal ring 103.

The semiconductor device according to the third embodiment has the following effects: the substrate 11 having semiconductor devices formed thereon is diced along the dicing region 101 into individual semiconductor devices (semiconductor chips). In the dicing process, an impact, stress, or the like, or cracks resulting from the impact, stress, or the like are generated in a dicing portion and propagate toward the chip region 102. Even if such an impact, stress, cracks, or the like destroy the outer void region 105b and propagate further toward the chip region 102, the impact, stress, cracks, or the like can be absorbed by the void region 105a provided inside the void region 105b. As a result, further propagation of the impact, stress, cracks, or the like toward the chip region 102 can be prevented. The seal ring 103 can thus prevented from being damaged, whereby one of original functions of the seal ring 103, that is, a function to prevent the entry of moisture, mobile ions, and the like from outside into the chip region 102, can be retained. A reliable semiconductor device can thus be provided.

Fourth Embodiment

Hereinafter, a semiconductor device and a manufacturing method thereof according to a fourth embodiment of the invention will be described with reference to the figures.

Figure 15:
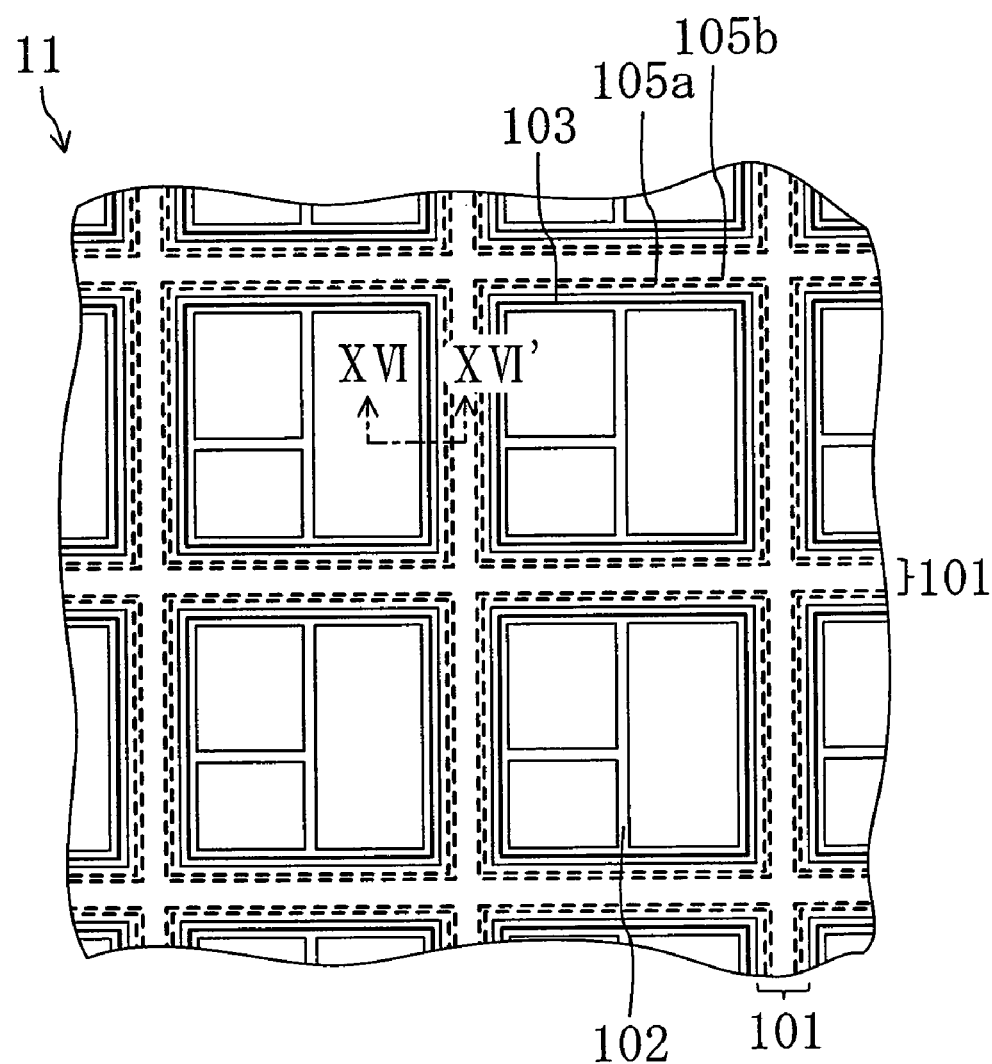
FIG. 15 is a plan view showing a part of a wafer having semiconductor devices of a fourth embodiment of the invention provided thereon.

FIG. 15 is a plan view showing a part of a wafer having semiconductor devices of the fourth embodiment (semiconductor devices each having a void region that is formed around a seal ring and includes a plurality of voids doubly and discontinuously surrounding a chip region so that discontinuous portions of the voids are not adjacent to each other) provided thereon.

As shown in FIG. 15, a plurality of chip regions 102 that will become semiconductor devices are provided on a wafer, that is, a semiconductor substrate 11 such as a silicon substrate. An IC formed by a plurality of elements and having a predetermined function is provided in each chip region 102. The chip regions 102 are separated from each other by a lattice-shaped dicing region 101.

A semiconductor device (i.e., a semiconductor chip) includes a chip region 102 where an IC formed by a plurality of elements and having a predetermined function is provided, a seal ring 103 provided in the periphery of the chip region 102 so as to surround the chip region 102, and two void regions 105a and 105b provided outside the seal ring 103 so as to doubly surround the seal ring 103. Each void region 105a, 105b includes a plurality of discontinuously arranged voids. The void regions 105a and 105b are arranged so that discontinuous portions of the voids in the void regions 105a are located so as not to be adjacent to discontinuous portion of the voids in the void region 105b. The semiconductor device of the fourth embodiment has the same structure as that of the semiconductor device of the third embodiment except that each of the two void regions 105a and 105b includes discontinuously arranged voids and discontinuous portions of the voids in the void regions 105a and discontinuous portion of the voids in the void region 105b are located so as not to be adjacent to each other.

Figure 16:
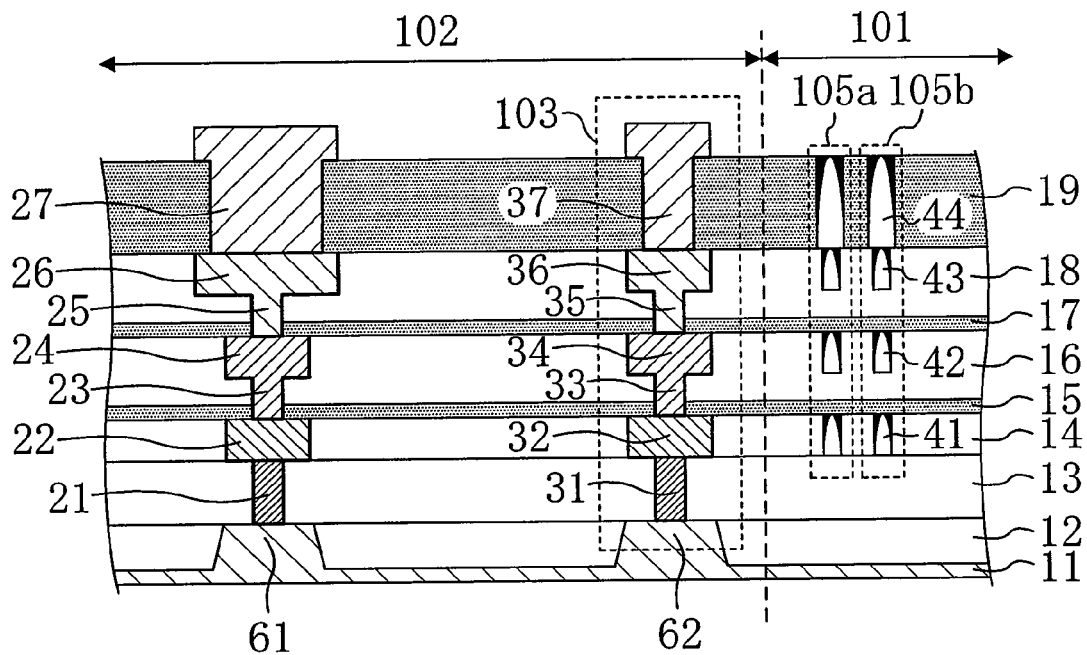
FIG. 16 is a cross-sectional view taken along line XVI-XVI' in FIG. 15.
Figure 17:
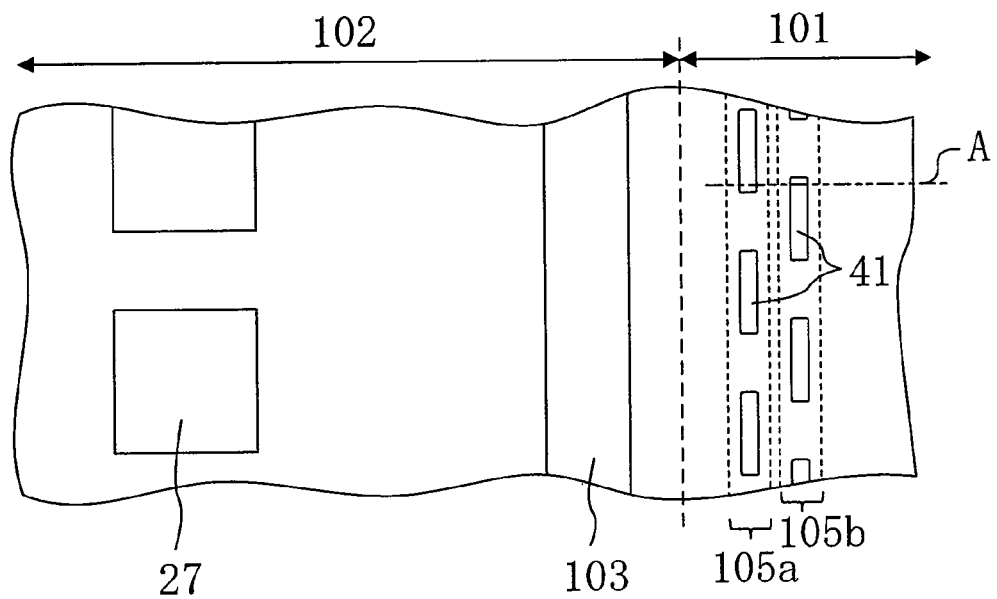
FIG. 17 is an enlarged plan view showing a region around line XVI-XVI' in FIG. 15.

This structure will be described in more detail with reference to FIGS. 16 and 17. FIG. 16 is a cross-sectional view taken along line XVI-XVI' in FIG. 15. In other words, FIG. 16 is a cross-sectional view of a region around an end portion of a semiconductor device including a seal ring 103 located in the periphery of a chip region 102 and void regions 105a and 105b (more specifically, an interconnection structure of the chip region 102, a structure of the seal ring 103, and the void regions 105a and 105b). FIG. 17 is an enlarged plan view showing a region near line XVI-XVI' in FIG. 15. Note that FIG. 16 shows a cross section including a region where a plurality of voids in the void regions 105a and 105b overlap each other (for example, line A in FIG. 17).

In the fourth embodiment, the void region 105 may have a more than double structure (e.g., a triple or quadruple structure) if the layout allows.

A manufacturing method of a semiconductor device of the fourth embodiment having the structure shown in FIGS. 15 through 17 is basically the same as the manufacturing method of a semiconductor device of the first embodiment except the layout of a double-structure void formation mask pattern in a photomask to be used.

As described above, according to the manufacturing method of a semiconductor device of the fourth embodiment, a seal ring 103 including first, second, and third seal vias 31, 33, and 35 and first, second, and third seal interconnects 32, 34, and 36 can be formed simultaneously with first, second, and third vias 21, 23, and 25 and first, second, and third interconnects 22, 24, and 26 in the chip region 102. Moreover, a void region having a double structure, that is, void regions 105a and 105b, can be formed outside the seal ring 103.

The semiconductor device according to the fourth embodiment has the following effects: the substrate 11 having semiconductor devices formed thereon is diced along the dicing region 101 into individual semiconductor devices (semiconductor chips).

If cracks, impact, and the like which are generated in a dicing process enter the chip region 102, the seal ring 103 or a portion inside the seal ring 103 may be damaged. Void regions are provided in the semiconductor device of this embodiment in order to prevent such damage. Since each void region 105a, 105b has discontinuously arranged voids, cracks, impact, and the like may pass through the discontinuous portions of the voids. In the semiconductor device of this embodiment, however, the discontinuous portions of the voids in the outer void region 105b and the discontinuous portions of the voids in the inner void region 105a are not adjacent to each other in the direction perpendicular to the extending direction of the seal ring 103. Cracks, impact, and the like that have passed through the discontinuous portions of the voids in the outer void region 105b (and have not been blocked by the outer void region 105b) are reliably blocked by the inner void region 105a.

In other words, when the chip region 102 is viewed from the dicing region 101 side, a plurality of voids of a plurality of void regions are arranged without a gap. Cracks, impact, and the like can therefore be reliably prevented from propagating from the wafer dicing portion toward the inside of the chip region. Since cracks, impact, and the like which are generated in a dicing process can be blocked before reaching the seal ring, the seal ring is neither chipped nor destroyed. As a result, a function of the seal ring to reliably protect the inside of the chip region is not degraded. Since the seal ring 103 can be prevented from being damaged, an original function of the seal ring 103, that is, a function to prevent the entry of moisture, mobile ions, and the like from outside into the chip region 102, can be retained. As a result, a reliable semiconductor device can be provided. Note that the voids in the void regions 105a and 105b may have any length as long as the discontinuous portions of the voids are not adjacent to each other.

Forming continuous voids extending in parallel with the seal ring reduces mechanical strength. It is therefore desirable to form discontinuous voids. In this case, cracks, impact, and the like may pass through the discontinuous portions of the voids. However, cracks, impact, and the like can be prevented from reaching the seal ring by forming the voids so that the voids doubly surround the seal ring and that the discontinuous portions of the voids are not adjacent to each other.

In the first though fourth embodiments, the seal ring 103 has a layered structure of seal vias and seal interconnects having a larger width than that of the seal vias. However, the seal interconnects may have the same width as that of the seal vias. Moreover, instead of the layered structure of seal vias and seal interconnects, the seal ring 103 may be formed only by the seal vias. This structure reduces the occupied area of the seal ring 103 in a width direction in the semiconductor device (a direction perpendicular to the direction in which the seal ring 103 extends along the periphery of the chip region 102) as compared to the case where the seal ring 103 has a layered structure of seal vias and seal interconnects. This structure is therefore useful for reduction in size of the semiconductor device.

Figure 18:
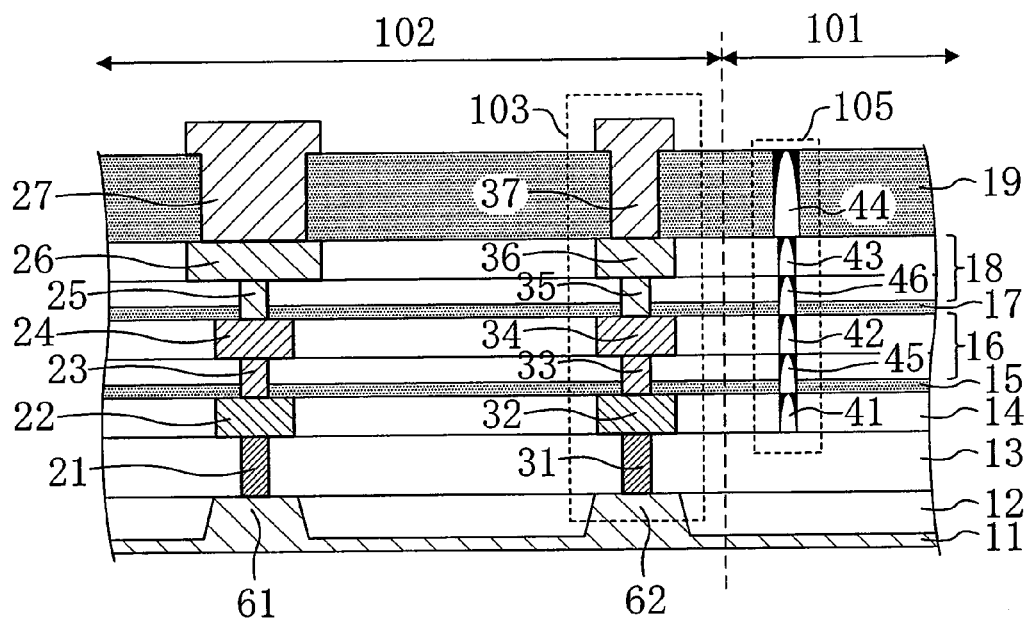
FIG. 18 is a cross-sectional view showing a variation of the semiconductor device according to the first through fourth embodiments of the invention.

In the first through fourth embodiments, a dual damascene method is used except for the interconnect in the lowest layer (the first via 21 and the first interconnect 22). However, a single damascene method may be used in which a metal is independently formed after an opening for a via (and a seal via) or an opening for an interconnect (and a seal interconnect), that is, a via hole or an interconnect groove, is formed. FIG. 18 shows an example of a cross-sectional shape obtained by using the single damascene method. In this case, both the fourth interlayer insulating film 16 and the sixth interlayer insulating film 18 have a two-layer structure, and voids 45 and 46 are formed in the respective lower layers of the fourth interlayer insulating film 16 and the sixth interlayer insulating film 18 (i.e., the respective layers in which the second via 23 and the third via 25 are formed). In the structure of FIG. 18, the void region 105 has a plurality of voids (41 through 46) located adjacent to each other in a thickness direction of the layered structure of the interlayer insulating films.

On the other hand, voids may be formed by using one of a via formation mask or an interconnect formation mask. In this case, a plurality of voids discontinuously arranged in the layered direction of the interlayer insulating films are formed in parallel with the seal ring 103.

In the case of using a dual damascene method, voids may be formed by using both a via formation mask and an interconnect formation mask. In this case, voids continuously arranged in the layered direction of the interlayer insulating films are formed in parallel with the seal ring 103 (for example, a cross-sectional shape shown in FIG. 19).

Figure 19:
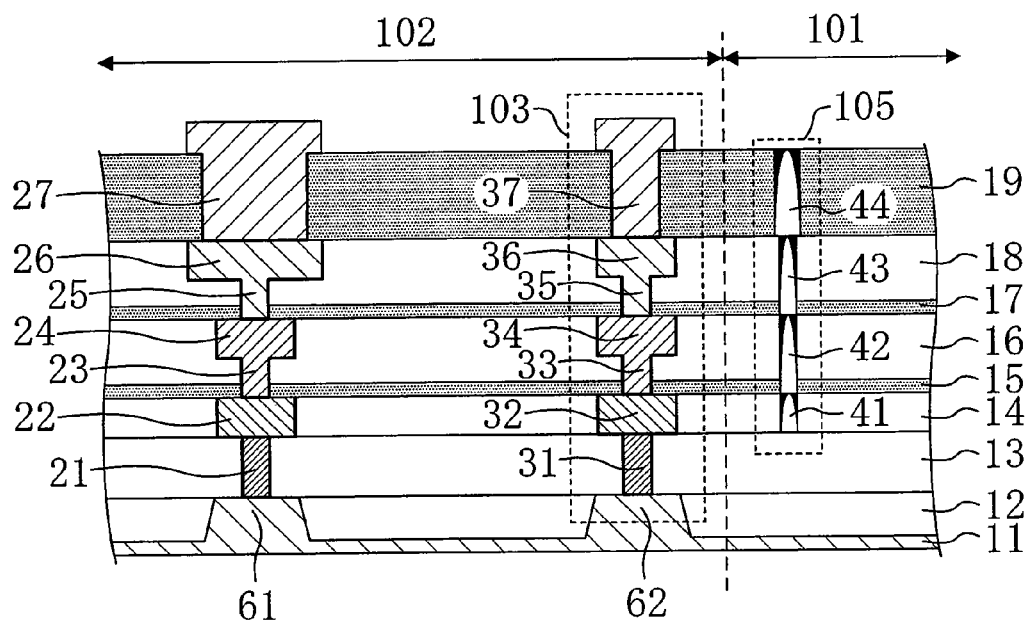
FIG. 19 is a cross-sectional view showing another variation of the semiconductor device according to the first through fourth embodiments of the invention.

In order to obtain this structure, in the step of FIG. 5A, for example, a void formation pattern is formed above the void 41 in the resist 52. In the step of FIG. 5B, a void formation groove is formed in addition to the second via hole 23a and the second seal via hole 33a by using the void formation pattern. As shown in FIG. 19, a void 42 extending through the third and fourth interlayer insulating films 15 and 16 is thus formed through the step of FIG. 6C.

In the first through fourth embodiments, a void included in the void region 105 (105a and 105b) need only be formed in at least one interlayer insulating film. A void may be selectively formed only in a layer formed by an interlayer film made of, for example, a carbon-containing silicon oxide film that is generally known as a low mechanical strength film.

In the first through fourth embodiments, the void region 105 (105a and 105b) is formed in the dicing region 101. However, the void region 105 (105a and 105b) need only be provided between the wafer dicing portion and the seal ring 103, and the position of the void region 105 (105a and 105b) is not limited to that shown in each embodiment. For example, the void region 105 (105a and 105b) may be provided outside the seal ring 103 near the boundary with the dicing region 101 in the chip region 102.

In the first through fourth embodiments, the seal ring 103 is provided near the boundary with the dicing region 101 in the chip region 102. However, the seal ring 103 may alternatively be provided inside the void region 105, for example, in a portion of the dicing region 101 which will remain as an end portion of a semiconductor device (semiconductor chip) after dicing (that is, near the boundary with the chip region 102 in the dicing region 101).

In the first through fourth embodiments, three interconnects and three vias are respectively formed in the six-layered interlayer insulating films. However, the number of interlayer insulating films is not limited to six and the number of interconnects and the number of vias are not limited to three. The number of interlayer insulating films, the number of interconnects, and the number of vias may be increased or decreased according to the chip structure.

In the first through fourth embodiments, the seal ring 103 has a single seal ring structure in a vertical direction. However, the seal ring 103 is not limited to a single seal ring structure. For example, the seal ring 103 may have a double or more seal ring structure or may have a partially branched seal ring structure.

In the first through fourth embodiments, Cu is used as a conductive material that forms the interconnects, the vias, and the seal ring 103. However, the invention is not limited to this. The interconnects, the vias, and the seal ring 103 may be made of at least one of W, Al, and Cu. In this case, the seal ring 103 can be made of the same material as that of the interconnects and the vias which are formed in the chip region 102 of the semiconductor device.

Figure 20:
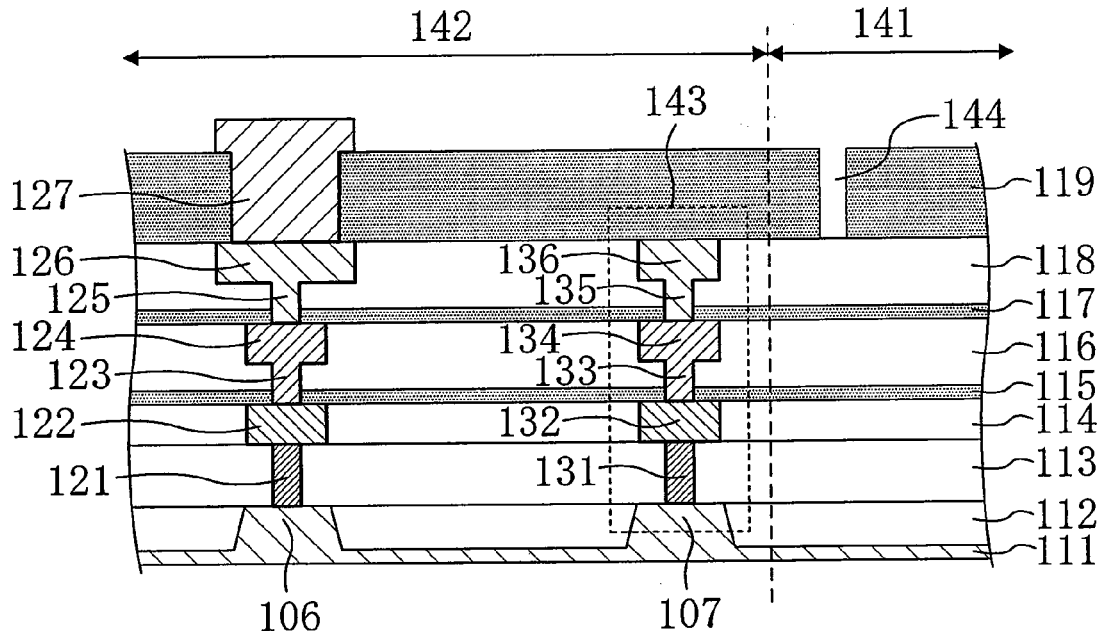
FIG. 20 is a cross-sectional view of a conventional semiconductor device.
Figure 21:
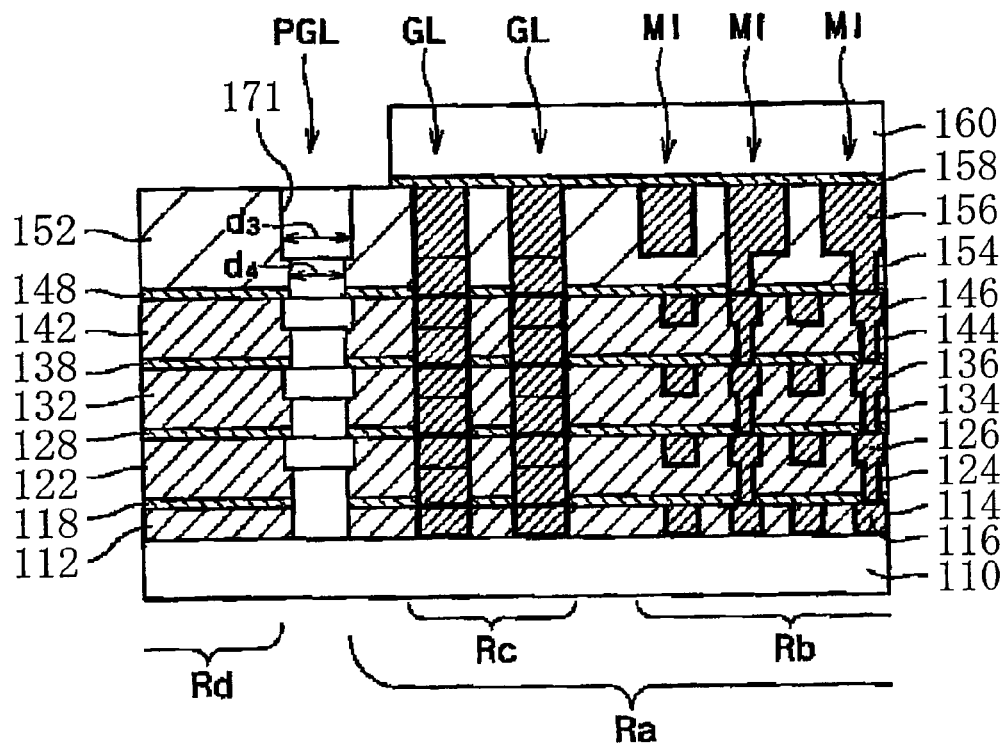
FIG. 21 is a cross-sectional view of another conventional semiconductor device.

In the first through fourth embodiments, a slit shown in Patent document 1 (144 in FIG. 20) may be formed in the passivation film 19. The position of the slit is not specifically limited as long as the slit is formed on the dicing region 101 side of the seal ring 103 and on the chip region 102 side of a portion to be cut by a dicing blade.

In the first through fourth embodiments, each of the first through sixth interlayer insulating films and the passivation film is a single film. However, at least one of the interlayer insulating films or the passivation film may have a layered structure of two or more kinds of films.

For example, in the forth interlayer insulating film, a layer in which an interconnect is formed and a layer in which a via is formed may be made of carbon-containing silicon oxide films having different relative permittivities from each other. In this case, a combination of two kinds of carbon-containing silicon oxide films may be selected so that the relative permittivity ($k1$) of the interlayer insulating film in which an interconnect is formed is lower than the relative permittivity ($k2$) of the interlayer insulating film in which a via is formed (i.e., $k1<k2$). In other words, a combination of different kinds of interlayer insulating films may be selected so that the interlayer insulating film in which an interconnect is formed has a higher carbon concentration or a larger hole amount (and therefore a lower relative permittivity) than the interlayer insulating film in which a via is formed.

As such a combination of interlayer insulating films that the interlayer insulating film for an interconnect layer has a lower relative permittivity than that of the interlayer insulating film for a via layer, a silicon oxide film such as TEOS (tetra-ethyl-ortho-silicate) or a fluorine-containing silicon oxide film may be used for the via layer, and a fluorine-containing silicon oxide film, a carbon-containing silicon oxide film, or the like may be used for the interconnect layer.

The use of such a film structure enables reduction in capacitance between interconnects in a layer in which an interconnect is formed. An insulating film having a low relative permittivity generally has low mechanical strength and is likely to be damaged by a dicing process. However, by selectively forming a void of the invention in the layer made of such a low mechanical strength film, propagation of a stress and cracks during a dicing process can be prevented, whereby the seal ring can be protected.

The third interlayer insulating film is generally required to have a Cu diffusion prevention function and an etch stop function during via pattern formation. By using a layered structure of a nitrogen-containing silicon carbide film and an oxygen-containing silicon carbide film as the third interlayer insulating film, increase in capacitance between interconnects can be prevented while retaining the Cu diffusion prevention function and the etch stop function due to the low relative permittivity of the film.

SiN (silicon nitride) is generally known to have a Cu diffusion prevention function because of the presence of N (nitrogen), and has a relative permittivity of about 7. SiC (silicon carbide) has a relative permittivity of about 3.5, but has a low Cu diffusion prevention function. Therefore, by adding N to SiC, that is, by using SiCN, both a low relative permittivity (about 4.8) and a Cu diffusion prevention function can be obtained. SiCO has a lower relative permittivity (about 4.6) than that of SiCN. However, Cu is oxidized because SiCO contains O (oxygen). Therefore, SiCN and SiCO are layered so that SiCN is located on the Cu side. As can be seen from the above description, both SiCN and SiCO have an etch stop function to an interlayer film such as a low dielectric constant film.

Moreover, the following effects are considered to be obtained when the passivation film has a layered structure of two or more kinds of films. For example, an oxygen- or nitrogen-containing silicon carbide film having a lower relative permittivity than that of a silicon nitride film may be formed right above an interconnect formed in the same layer as that of the sixth interlayer insulating film, and a silicon nitride film may be formed on the surface of the oxygen- or nitrogen-containing silicon carbide film. In this way, increase in the capacitance between interconnects can be prevented.

Moreover, a passivation film having a layered structure has a reduced film stress as compared to a passivation film having a single layer structure. In other words, even if a film stress causes warping, each layer of the layered structure has a smaller film thickness and therefore a lower stress amount than the layer of the single film structure. Moreover, since the layered structure has an interface, distortion is reduced. A film stress can thus be reduced by using a passivation film having a layered structure.

As has been described above, the invention relates to a semiconductor device having a seal ring formed so as to surround a chip region and a mechanism for protecting the seal ring, and a manufacturing method of the semiconductor device. According to the invention, cracks, stress, and the like which are generated during a dicing process are blocked by a void region formed outside the seal ring, whereby a function of the seal ring to reliably protect the inside of the chip region can be retained. The invention is therefore very useful.

What is claimed is:

1. A semiconductor device, comprising:
    an element formed on a substrate;
    an insulating film formed on the substrate;
    a seal ring formed in the insulating film so as to surround a region where the element is formed and to extend through the insulating film; and
    a void region including at least one void and formed in the insulating film in a region located outside the seal ring when viewed from the element, wherein:
    the insulating film has a layered structure of a plurality of interlayer insulating films, and includes a via formed in at least one of the plurality of interlayer insulating films and electrically connected to the element, and an interconnect formed in at least one of the plurality of interlayer insulating films and electrically connected to the element, the seal ring includes a seal via formed in the interlayer insulating film in which the via is formed, and a seal interconnect formed in the interlayer insulating film in which the interconnect is formed, and the void region includes a void formed at least in the interlayer insulating film in which the seal interconnect is formed, the interconnect and the via are respectively formed in different interlayer insulating films of the plurality of interlayer insulating films, and
    the interlayer insulating film in which the interconnect is formed is made of a film having a lower dielectric constant than that of the interlayer insulating film in which the via is formed.

2. The semiconductor device according to claim 1, wherein a width of the void is smaller than that of the interconnect.

3. The semiconductor device according to claim 1, further comprising a dual damascene interconnect in which the via and the interconnect are formed integrally.

4. The semiconductor device according to claim 1, further comprising a passivation film formed on the insulating film, wherein the seal ring is formed so as to extend through the insulating film and the passivation film, and the void region further includes another void formed in the passivation film in a region located outside the seal ring when viewed from the element.

5. The semiconductor device according to claim 4, wherein the passivation film has a layered structure of a plurality of films.

6. The semiconductor device according to claim 1, wherein the void region includes a plurality of voids discontinuously arranged in a thickness direction of the insulating film.

7. The semiconductor device according to claim 1, wherein the void region includes a plurality of voids arranged so as to be adjacent to each other in a thickness direction of the insulating film.

8. The semiconductor device according to claim 1, wherein the void region includes a void formed outside the seal ring when viewed from the element so as to continuously surround the seal ring without a gap.

9. The semiconductor device according to claim 1, wherein the void region includes a plurality of voids formed outside the seal ring when viewed from the element so as to discontinuously surround the seal ring.

10. The semiconductor device according to claim 1, further comprising at least one other void region including at least one void and formed outside the void region when viewed from the element.

11. The semiconductor device according to claim 10, wherein the at least one other void region includes a void formed outside the seal ring when viewed from the element so as to continuously surround the seal ring without a gap.

12. The semiconductor device according to claim 10, wherein the at least one other void region includes a plurality of voids formed outside the seal ring when viewed from the element so as to discontinuously surround the seal ring.

13. The semiconductor device according to claim 10, wherein each of the void region and the at least one other void region includes a plurality of voids formed outside the seal ring when viewed from the element so as to discontinuously surround the seal ring, and a space between the plurality of voids in the void region and a space between the plurality of voids in the at least one other void region are arranged so as not to be adjacent to each other in a direction perpendicular to an extending direction of the seal ring.

14. The semiconductor device according to claim 9, wherein at least one of the plurality of voids arranged so as to surround the seal ring has a different dimension in an extending direction of the seal ring from that of the remainder of the voids.

15. A semiconductor device, comprising:
    an element formed on a substrate;
    an insulating film formed on the substrate;

a seal ring formed in the insulating film so as to surround a region where the element is formed and to extend through the insulating film; and a void region including at least one void and formed in the insulating film in a region located outside the seal ring when viewed from the element, wherein:

the insulating film has a layered structure of a plurality of interlayer insulating films, and includes a via formed in at least one of the plurality of interlayer insulating films and electrically connected to the element, and an interconnect formed in at least one of the plurality of interlayer insulating films and electrically connected to the element, the seal ring includes a seal via formed in the interlayer insulating film in which the via is formed, and a seal interconnect formed in the interlayer insulating film in which the interconnect is formed, and the void region includes a void formed at least in the interlayer insulating film in which the seal interconnect is formed, a part of the interlayer insulating film in which the interconnect is formed has a lower dielectric constant than that of another part of the interlayer insulating film in which the via is formed.

16. The semiconductor device according to claim 15, further comprising a passivation film formed on the insulating film, wherein the seal ring is formed so as to extend through the insulating film and the passivation film, and the void region further includes another void formed in the passivation film in a region located outside the seal ring when viewed from the element.

17. The semiconductor device according to claim 15, wherein the void region includes a plurality of voids discontinuously arranged in a thickness direction of the insulating film.

18. The semiconductor device according to claim 15, wherein the void region includes a void formed outside the seal ring when viewed from the element so as to continuously surround the seal ring without a gap.

19. The semiconductor device according to claim 15, further comprising at least one other void region including at least one void and formed outside the void region when viewed from the element.

20. The semiconductor device according to claim 19, wherein the at least one other void region includes a void formed outside the seal ring when viewed from the element so as to continuously surround the seal ring without a gap.

21. The semiconductor device according to claim 15, wherein the void region includes a plurality of voids arranged so as to be adjacent to each other in a thickness direction of the insulating film.

22. The semiconductor device according to claim 15, wherein the void region includes a plurality of voids formed outside the seal ring when viewed from the element so as to discontinuously surround the seal ring.

23. The semiconductor device according to claim 19, wherein the at least one other void region includes a plurality of voids formed outside the seal ring when viewed from the element so as to discontinuously surround the seal ring.

24. The semiconductor device according to claim 19, wherein each of the void region and the at least one other void region includes a plurality of voids formed outside the seal ring when viewed from the element so as to discontinuously surround the seal ring, and a space between the plurality of voids in the void region and a space between the plurality of voids in the at least one other void region are arranged so as not to be adjacent to each other in a direction perpendicular to an extending direction of the seal ring.

25. The semiconductor device according to claim 22, wherein at least one of the plurality of voids arranged so as to surround the seal ring has a different dimension in an extending direction of the seal ring from that of the remainder of the voids.

* * * * *